United States Patent
Fujita et al.

(10) Patent No.: US 10,938,075 B2
(45) Date of Patent: Mar. 2, 2021

(54) BATTERY SAFETY EVALUATION APPARATUS, BATTERY CONTROL APPARATUS, BATTERY SAFETY EVALUATION METHOD, NON-TRANSITORY COMPUTER READABLE MEDIUM, CONTROL CIRCUIT, AND POWER STORAGE

(71) Applicant: KABUSHIKI KAISHA TOSHIBA, Minato-ku (JP)

(72) Inventors: Yumi Fujita, Chuo (JP); Tomokazu Morita, Funabashi (JP); Nobukatsu Sugiyama, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/292,378

(22) Filed: Mar. 5, 2019

(65) Prior Publication Data
US 2019/0198938 A1     Jun. 27, 2019

Related U.S. Application Data

(63) Continuation of application No. PCT/JP2018/006540, filed on Feb. 22, 2018.

(30) Foreign Application Priority Data

Sep. 20, 2017    (JP) .............................. JP2017-180202

(51) Int. Cl.
*H02J 7/00*          (2006.01)
*H01M 10/42*      (2006.01)
(Continued)

(52) U.S. Cl.
CPC ....... *H01M 10/4285* (2013.01); *B60L 3/0046* (2013.01); *B60L 3/12* (2013.01);
(Continued)

(58) Field of Classification Search
CPC ................................................. H01M 10/4285
(Continued)

(56) References Cited

U.S. PATENT DOCUMENTS 8,797,000 B2 * 8/2014 Kubota ................... H02J 7/027
                                                           320/162
9,213,070 B2    12/2015 Hoshino et al.
(Continued)

FOREIGN PATENT DOCUMENTS

JP    10-255852     9/1998
JP    2009-80093     4/2009
(Continued)

OTHER PUBLICATIONS

International Search Report dated May 15, 2018 in PCT/JP2018/006540 filed Feb. 22, 2018.

*Primary Examiner* — Yalkew Fantu
(74) *Attorney, Agent, or Firm* — Oblon, McClelland, Maier & Neustadt, L.L.P.

(57) ABSTRACT

A battery safety evaluation apparatus as an aspect of the present invention includes an estimator, a calculator, and an evaluator. The estimator estimates an estimation value of an inner state parameter of a battery to be evaluated on the basis of data of its voltage and current measured in charging or discharging it. The calculator calculates an index regarding swelling risk of the battery on the basis of first reference data. The evaluator evaluates, on the basis of the index, a battery swelling risk of the battery to evaluate safety of the battery. The battery is a secondary battery. The first reference data is reference data considered to correspond to the battery from the reference data on the basis of estimation value. The reference data indicates at least one of relation- (Continued)

ships between a positive electrode capacity, a negative electrode capacity and an SOC deviation of a secondary battery.

16 Claims, 15 Drawing Sheets

(51) Int. Cl.

| | |
|---|---|
| *G01R 31/3842* | (2019.01) |
| *H01M 10/633* | (2014.01) |
| *B60L 3/00* | (2019.01) |
| *H01M 10/48* | (2006.01) |
| *B60L 58/16* | (2019.01) |
| *B60L 58/13* | (2019.01) |
| *B60L 3/12* | (2006.01) |
| *G01B 7/16* | (2006.01) |
| *H01M 10/44* | (2006.01) |
| *B60L 58/12* | (2019.01) |
| *G01R 31/392* | (2019.01) |

(52) U.S. Cl.
CPC ............. *B60L 58/13* (2019.02); *B60L 58/16* (2019.02); *G01B 7/16* (2013.01); *G01R 31/3842* (2019.01); *H01M 10/425* (2013.01); *H01M 10/44* (2013.01); *H01M 10/482* (2013.01); *H01M 10/488* (2013.01); *H01M 10/633* (2015.04); *H02J 7/0026* (2013.01); *H02J 7/0029* (2013.01); *B60L 58/12* (2019.02); *B60L 2240/545* (2013.01); *B60L 2250/10* (2013.01); *B60L 2260/44* (2013.01); *G01R 31/392* (2019.01); *H01M 2010/4271* (2013.01); *H01M 2010/4292* (2013.01); *H01M 2200/00* (2013.01)

(58) Field of Classification Search
USPC .......................................... 320/134
See application file for complete search history.

(56) References Cited

U.S. PATENT DOCUMENTS

| | | | |
|---|---|---|---|
| 2006/0076930 A1* | 4/2006 | Ooshita ............. | H01M 10/42 320/134 |
| 2006/0255768 A1* | 11/2006 | Yoshio ............... | H02J 7/0029 320/134 |
| 2010/0201323 A1* | 8/2010 | Okamura ........... | H02J 7/0072 320/134 |
| 2012/0286739 A1* | 11/2012 | O'Brien, Jr. ....... | H01M 10/482 320/134 |
| 2014/0084873 A1 | 3/2014 | Sim et al. | |
| 2015/0260798 A1 | 9/2015 | Sugiyama et al. | |
| 2016/0116548 A1 | 4/2016 | Ghantous et al. | |
| 2017/0263984 A1* | 9/2017 | Fujita ................. | G01R 31/374 |
| 2018/0267108 A1* | 9/2018 | Morita ............... | H01M 10/441 |

FOREIGN PATENT DOCUMENTS

| | | |
|---|---|---|
| JP | 2011-9042 A | 1/2011 |
| JP | 2011-78180 | 4/2011 |
| JP | 2012-195055 | 10/2012 |
| JP | 2015-175753 | 10/2015 |
| JP | 5889548 B2 | 3/2016 |
| JP | 2016-93066 | 5/2016 |
| JP | 2016-119249 | 6/2016 |
| JP | 2016-122505 | 7/2016 |
| JP | 2016-177941 | 10/2016 |
| JP | 2017-147021 A | 8/2017 |

\* cited by examiner

BATTERY SAFETY EVALUATION APPARATUS, BATTERY CONTROL APPARATUS, BATTERY SAFETY EVALUATION METHOD, NON-TRANSITORY COMPUTER READABLE MEDIUM, CONTROL CIRCUIT, AND POWER STORAGE

CROSS-REFERENCE TO RELATED APPLICATION(S)

This application is a Continuation of International Application No. PCT/JP2018/006540, filed on Feb. 22, 2018, which claims priority to Japanese Patent Application No. 2017-180202 filed on Sep. 20, 2017. The entire contents of these applications are hereby incorporated by reference.

FIELD

Embodiments described herein relate generally to a battery safety evaluation apparatus, a battery control apparatus, a battery safety evaluation method, a non-transitory computer readable medium, a control circuit, and a power storage system.

BACKGROUND

There is known high energy density of nonaqueous electrolyte secondary batteries such as lithium ion batteries, which are widely used for component batteries (unit cells or cells) of an assembled battery (battery pack). For example, a laptop PC uses an assembled battery composed of several cells, an electric vehicle uses an assembled battery composed of tens to thousands of cells, and a power line system uses an assembled battery composed of ten thousand or more cells.

Meanwhile, it is also known that such nonaqueous electrolyte secondary batteries have risks of fuming, firing and the like caused by progress of battery swelling due to its use and its deterioration progress, which reduces safety.

Therefore, a device including an assembled battery generally has a plurality of safety features such as a feature to stop using in order to secure safety. Battery swelling is detected in recent years by implementing a center which detects change in surface shape of the battery. However, there is no method for detecting a precursory phenomenon of battery swelling (in particular, a precursory phenomenon of rapid battery expansion) caused by irreversible thickness increase such as swelling caused by deformation of an electrode and an electrode group due to gas generation or a deterioration product from a cell (cells) in use. This makes complete prevention of firing of a cell (cells) difficult. Therefore, in order to evaluate and secure present safety of a storage battery system, it is needed to nondestructively examine and secure a precursory phenomenon of battery swelling caused by irreversible thickness increase in a present storage battery or the similar phenomenon.

DETAILED DESCRIPTION

According to embodiments, safety of a secondary battery is nondestructively evaluated.

A battery safety evaluation apparatus as an aspect of the present invention includes an estimator, a calculator, and an evaluator. The estimator estimates an estimation value of an inner state parameter of a battery to be evaluated on the basis of data of its voltage and current measured in charging or discharging it. The calculator calculates an index regarding swelling risk of the battery on the basis of first reference data. The evaluator evaluates, on the basis of the index, a battery swelling risk of the battery to evaluate safety of the battery. The battery is a secondary battery. The first reference data is reference data considered to correspond to the battery from the reference data on the basis of estimation value. The reference data indicates at least one of relationships between a positive electrode capacity, a negative electrode capacity and an SOC deviation of a secondary battery.

Below, a description is given of embodiments of the present invention with reference to the drawings. The present invention is not limited to the embodiments.

First Embodiment

Figure 1:
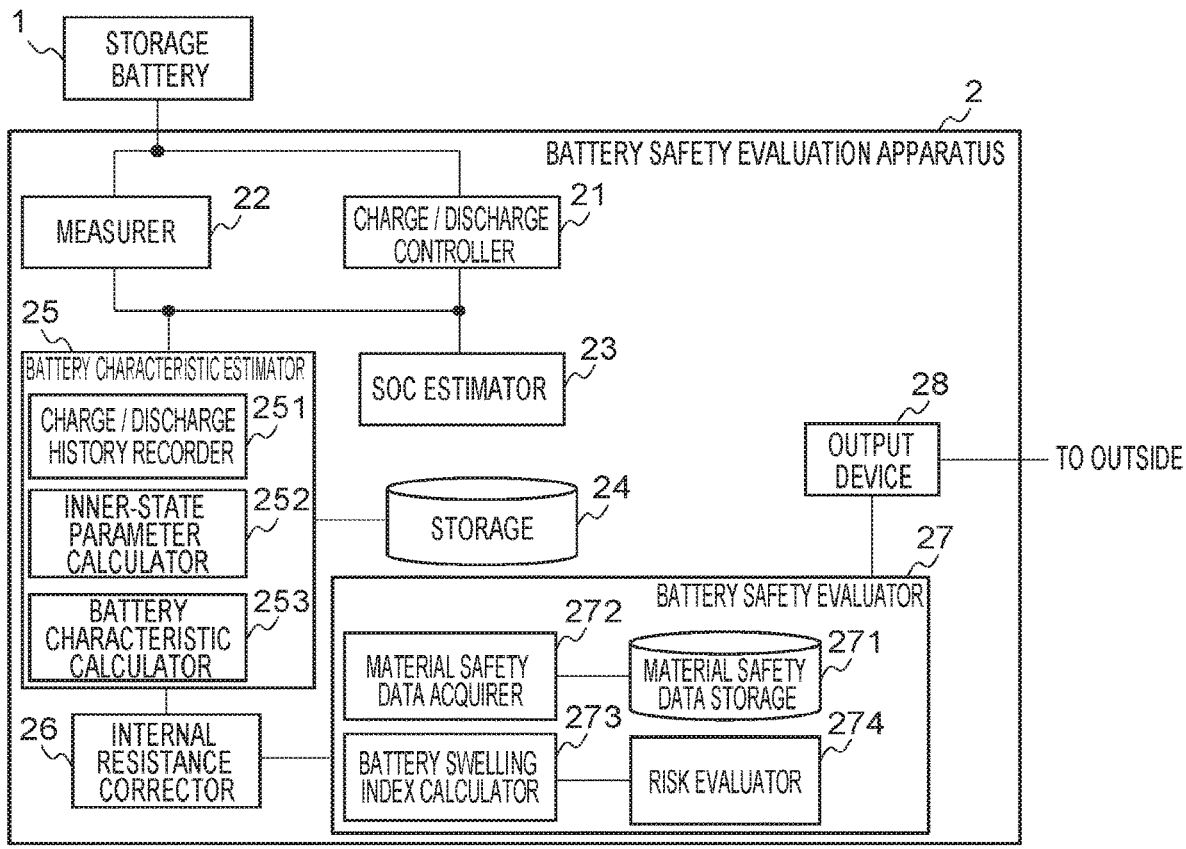
FIG. 1 is a block diagram illustrating an example of a schematic configuration of a power storage system including a battery safety evaluation apparatus according to a first embodiment.

FIG. 1 is a block diagram illustrating an example of a schematic configuration of a power storage system including a battery safety evaluation apparatus according to a first embodiment. The power storage system includes a storage battery 1 (a first battery) and a battery safety evaluation apparatus 2. The battery safety evaluation apparatus 2 includes a charge/discharge controller 21, a measurer 22, an SOC (state of charge) estimator 23, a storage 24, a battery characteristic estimator 25, an internal-resistance corrector 26, and a battery safety evaluator 27 and an output device 28. The battery characteristic estimator 25 includes a charge/discharge history recorder 251, an inner-state parameter calculator 252, and a battery characteristic calculator 253. The battery safety evaluator 27 includes a material safety data storage 271, a material safety data acquirer (reference data acquirer) 272, a battery swelling index calculator 273 and a risk determiner 274.

Incidentally, the battery safety evaluation apparatus 2 realized by a CPU, a control circuit or the like may be provided to the storage battery 1 such that the battery safety evaluation apparatus 2 is realized so as to be integrated with the storage battery 1.

The storage battery 1 is a battery to be evaluated in its safety by the battery safety evaluation apparatus 2. The storage battery 1 may be a unit cell (cell) or may include one or more battery packs. Each battery pack may include one or more battery modules. Each battery module may include a plurality of unit cells (cells). The numbers of battery modules included in the individual battery packs may be the same or different from one another. Moreover, the numbers of unit cells included in the individual battery modules may be the same or different from one another.

The unit cell only has to be a rechargeable secondary battery. Herein, description is made, supposing that it is a lithium ion secondary battery.

Incidentally, charge/discharge may mean any one of charge and discharge or may mean both of these. Moreover, in the description below, unless otherwise mentioned, the term "storage battery" includes an assembled battery, a battery module and a unit cell.

The storage battery 1 may be a storage battery, for example, for storage battery-installed devices such as cellular phones and laptop computers for mobile use, or for storage battery-installed devices such as electric bicycles, electric vehicles, hybrid vehicles using both electricity and gasoline, and drones for vehicle implementation use. Further, the storage battery 1 may be a stationary storage battery that is installed for each structure such as a private house, a building, and a factory. The storage battery 1 may be a storage battery linked with, or interconnected with a power generation system.

The battery safety evaluation apparatus 2 evaluates safety of the storage battery 1. Specifically, the battery safety evaluation apparatus 2 estimates a present state of the storage battery 1 being used. Next, in the estimated state, a battery swelling index regarding battery swelling of the storage battery 1 is calculated from a positive electrode capacity, a negative electrode capacity, an SOC deviation and the like of the storage battery 1. As the battery swelling, for example, battery swelling caused by deformation of an electrode and an electrode group due to gas generation or a deterioration product is supposed. Then, a swelling risk of the storage battery 1 under supposed conditions of use in the future is evaluated.

As described above, the battery safety evaluation apparatus 2 also estimates the state of the connected storage battery 1. Specifically, the battery safety evaluation apparatus 2 estimates inner state parameters and battery characteristics which are information regarding the state of the storage battery 1 on the basis of data on voltage and current of the storage battery 1 measured in charging/discharging the storage battery 1. The inner state parameters and the battery characteristics will be described later. In other words, the battery safety evaluation apparatus 2 is a state estimation apparatus, and a battery control apparatus.

A method for estimating the state of the storage battery 1 on the basis of the frequency of use or the number of times of use may be adopted. However, the state of a storage battery may vary depending on the use environment or a load even when the frequency of use or the number of times of use is same. Therefore, in order to estimate the state of the storage battery 1 with high accuracy, the battery safety evaluation apparatus 2 estimates the state or performance of the storage battery 1 from measurement values of charge/discharge and the like.

Incidentally, it is supposed that the battery safety evaluation apparatus 2 uses material safety data (reference data) in order to evaluate a battery swelling risk. The material safety data will be described later. The description of details of operations of the battery safety evaluation apparatus 2 will be also given later.

Incidentally, the system configuration described above is exemplary, and the present invention is not limited to the aforementioned configuration. For example, in FIG. 1, the battery safety evaluation apparatus 2 includes the storage 24 and the material safety data storage 271. However, the storage 24 and the material safety data storage 271 may be configured into a single storage 24. In addition, the internal-resistance corrector 26 may be included in the battery characteristic estimator 25.

As long as information necessary for a process is received from the battery safety evaluation apparatus 2 and the process result is transferred to the battery safety evaluation apparatus 2 by communication or an electrical signal, the components of the battery safety evaluation apparatus 2 may be outside the battery safety evaluation apparatus 2. For example, the battery safety evaluation apparatus 2 may be separated into a battery control apparatus including the charge/discharge controller 21, a battery characteristic estimation apparatus including the measurer 22, the SOC estimator 23, the storage 24, the battery characteristic estimator 25 and the internal resistance corrector 26, and a battery safety evaluation apparatus including the battery safety evaluator 27.

Figure 2:
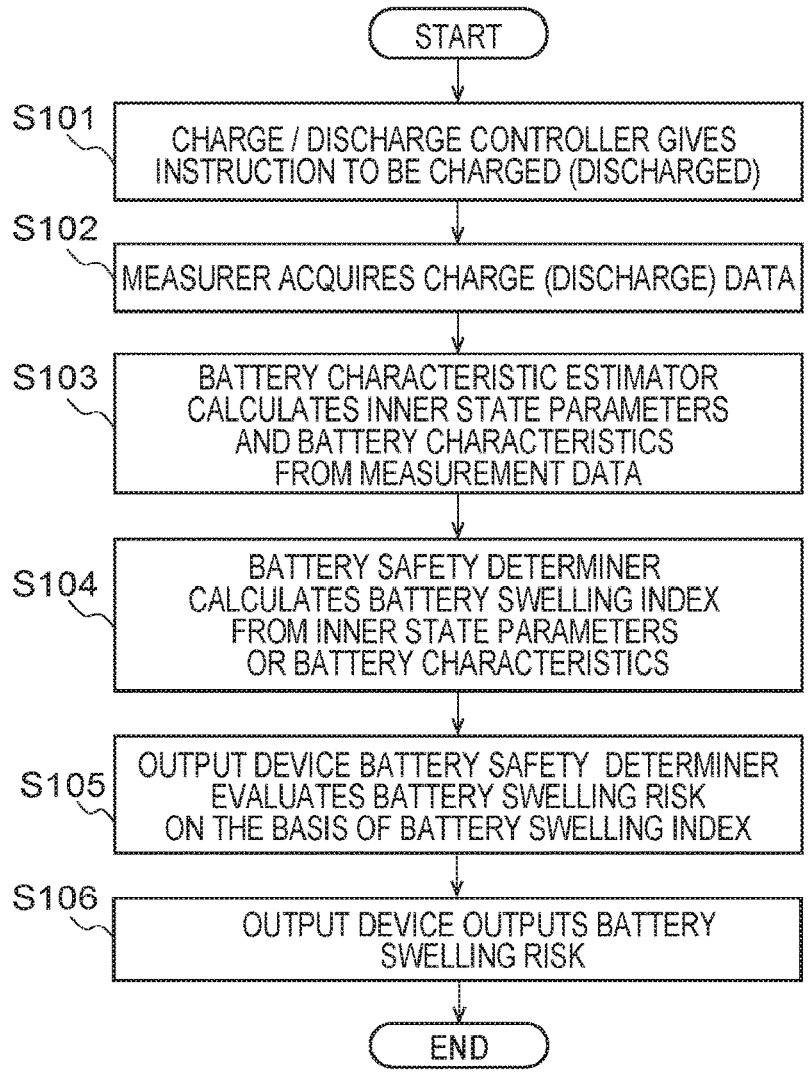
FIG. 2 is a diagram illustrating an example of a flowchart on schematic processes of the battery safety evaluation apparatus of the first embodiment.

Next, an outline of processes of the battery safety evaluation apparatus 2 is described. FIG. 2 is a diagram illustrating an example of a flowchart on schematic processes of the battery safety evaluation apparatus 2. The process may be performed at every elapse of a fixed period. Otherwise, it may be performed upon reception of an instruction from a user, another system or the like through a not-shown input device.

The charge/discharge controller 21 gives the storage battery 1 an instruction to be charged (or discharged) under a predetermined condition (S101). The measurer 22 acquires the charge (discharge) data by a measurement (S102). The battery characteristic estimator 25 analyzes the charge (discharge) data (S103). Analyzing the charge result is calculating the inner state parameters and the battery characteristics (cell characteristics) of each unit cell on the basis of the charge result. More specifically, the inner state parameters are estimated on the basis of current and voltage data measured during the charge and discharge. Further, the battery characteristics are estimated on the basis of the inner state parameters.

The inner state parameters each indicate the state of a unit cell. The inner state parameters are assumed to include a positive electrode capacity (the mass of the positive electrode), a negative electrode capacity (the mass of the negative electrode), an SOC deviation, and an internal resistance. The SOC deviation means a difference between the initial charge amount of the positive electrode and the initial charge amount of the negative electrode.

The battery characteristics can be calculated from the inner state parameters, and represent characteristics including the voltage of the storage battery 1. The battery characteristics are assumed to include a battery capacity, an open circuit voltage (OCV), an OCV curve, and the like. The internal resistance may be included also in the battery characteristics. The OCV curve means a graph (a function) indicating the relationship between the open circuit voltage and a certain index regarding the storage battery. The battery capacity is within a range in which the positive electrode capacity range overlaps with the negative electrode capacity range. When the SOC is 100%, the potential difference between the positive electrode and the negative electrode is an end-of-charge voltage. When the SOC is 0%, the potential difference between the positive electrode and the negative electrode is an end-of-discharge voltage. In this way, the battery capacity can be calculated on the basis of a charge amount.

The battery safety evaluator 27 calculates an index for determining the battery swelling risk from the inner state parameters or the battery characteristics (cell characteristics), on the basis of the material safety data acquired from the material safety data storage 271 (S104). The index is expressed as "battery swelling index". Then, the battery safety evaluator 27 evaluates the battery swelling risk on the basis of the battery swelling index (S105). This evaluation is expressed as "(battery swelling) risk evaluation". The output device 28 outputs the risk evaluation in a manner where a user or the like can recognize it (S106). For example, it may be displayed on a display or the like. In this way, the battery swelling risk of the storage battery 1 can be recognized.

Incidentally, the battery swelling index may be the same as the risk evaluation. In other words, the battery swelling index may be output without the risk evaluation performed. For example, when the battery swelling index is a numerical value, if a user or the like can determine the risk with the numerical value, the output device 28 may output the battery swelling index without the process of the risk evaluation (S105) performed.

Next, the components included in the battery safety evaluation apparatus 2 will be described.

The charge/discharge controller 21 gives the storage battery 1 an instruction to be charged or discharged in order to measure the inner state parameters of the storage battery 1. The charge/discharge may be performed for every fixed period or at fixed times. Otherwise, the charge/discharge may be performed upon reception, by the battery safety evaluation apparatus 2, of an instruction from a user, another system or the like through a not-shown input device.

The measurer 22 measures information about the storage battery 1. Examples of the information to be measured include the voltage between positive electrode terminals and negative electrode terminals of unit cells, current flowing through unit cells, and the temperatures of unit cells. Data measured by the measurer 22 includes the voltage, the current, and the temperature of the storage battery 1 which are measured during charge or discharge of the storage battery 1.

The SOC estimator 23 estimates the present SOC (state of charge) of the storage battery 1 on the basis of the data measured by the measurer 22. Incidentally, the SOC may be estimated using an SOC-OCV curve calculated by the battery characteristic estimator 25 on the basis of the present state of the storage battery 1.

The storage 24 stores data to be used for a process according to the battery characteristic estimator 25. For example, the storage 24 stores a function showing the relationship between the charge amount and the potential of the positive electrode or the negative electrode of a unit cell. The storage 24 may store other data.

The battery characteristic estimator 25 calculates the present inner state parameters and the present battery characteristics of the storage battery 1 on the basis of the data measured by the measurer 22. The battery characteristics may not be calculated, if unneeded. As described above, the battery characteristics include a battery capacity, an internal resistance, an open circuit voltage (OCV), and an OCV curve. The OCV curve (a function) may be a function showing the relationship between the open circuit voltage (OCV) of the secondary battery and the charge state of the secondary battery or the quantity of electric charges charged in the secondary battery, for example. Alternatively, the OCV curve may be an SOC-OCV graph which illustrates the relationship between the SOC and the OCV, or may be a charge amount-OCV graph which illustrates the relationship between the charge amount and the OCV. The type of an OCV curve to be calculated may be defined in advance.

To calculate the battery characteristics, various types of a battery characteristics measurement method can be used. More specifically, the examples of the method include a charge or discharge experiment in which a battery capacity is actually measured by supplying current, a current pausing method in which an internal resistance value is mainly measured, and an electrochemical measurement such as an AC impedance measurement. Measurement may be performed by combination thereof. Alternatively, a method in which battery characteristics are simply estimated by analyzing a charge or discharge curve may be used.

The inner configuration of the battery characteristic estimator 25 is described.

The charge/discharge history recorder 251 records data (a history) of voltages, currents, and temperatures, or the like measured by the measurer 22 during charge or discharge of the storage battery 1. The recording is repeatedly performed at predetermined time intervals from start of charge/discharge of the storage battery 1 to completion of the charge/discharge. The time intervals may be freely set according to a process in which the record is to be used. For example, the time intervals may be set to approximately 0.1 to 1 second intervals. A time at which the recording is performed may be an absolute time, or may be a relative time which is counted from start of charge/discharge. When the process performed by the charge/discharge history recorder 251 is repeated at the predetermined time intervals, recording of a time may be omitted.

Figure 3:
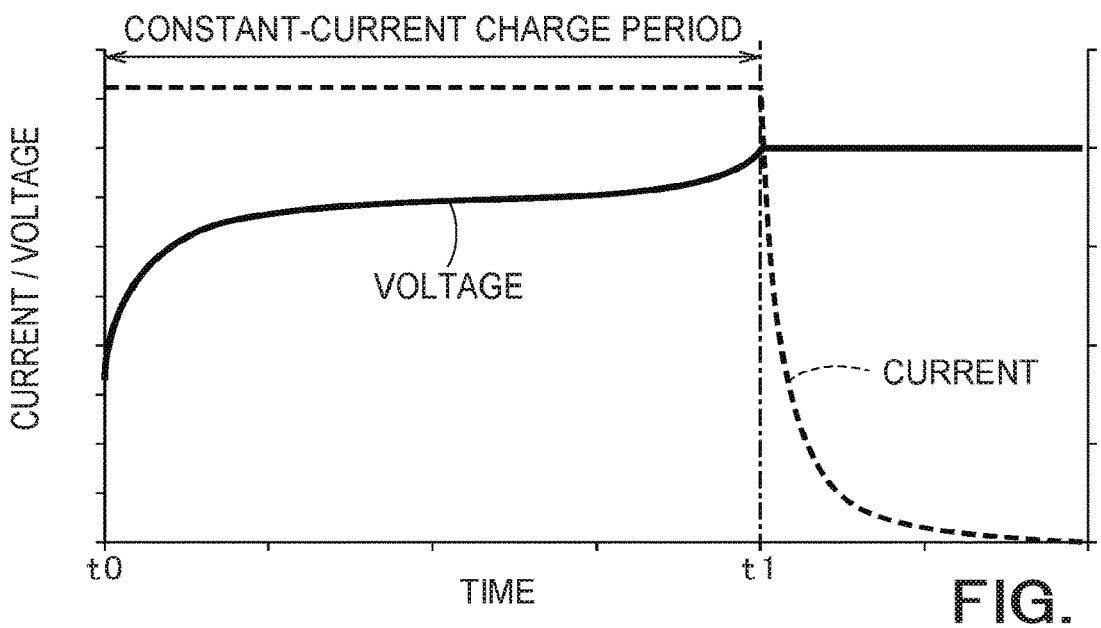
FIG. 3 illustrates an example of data regarding a current and a voltage during charge.

FIG. 3 illustrates an example of data regarding a current and a voltage during charge. The data illustrated in FIG. 3 is an example in constant-current constant-voltage charge, which is generally used as a charge method for secondary batteries. In FIG. 3, the broken line represents a current history and the solid line represents a voltage history.

In a process performed by the inner-state parameter calculator 252, which is described later, the charge history of the whole constant-current constant-voltage charge may be used, or only the charge history of a constant-current charge period (t0 to t1 in FIG. 3) may be used, for example. Incidentally, charge is not necessarily started when the SOC is 0%, and may be started when the SOC is 20%, for example.

The inner-state parameter calculator 252 calculates an amount of an active material forming the positive electrode or the negative electrode of a unit cell, an initial charge amount, the internal resistance of a unit cell, which are the inner state parameters, on the basis of the history recorded by the charge/discharge history recorder 251.

The inner-state parameter calculator 252 uses a function for calculating a storage battery voltage on the basis of the active material amounts and the internal resistance. The voltage of the storage battery 1 is calculated on the basis of current data and voltage data in charging/discharging the storage battery 1 and the function. The active material amount and the internal resistance which reduce a difference between a measured voltage and the calculated voltage of the storage battery 1 are obtained through regression calculation. The positive electrode may be made from a plurality of active materials. However, in the present embodiment, an example of a secondary battery having a positive electrode and a negative electrode each made from one active material is explained.

When the secondary battery having a positive electrode and a negative electrode each made from one active material is charged, a voltage (a terminal voltage) "$V_t$" at time "t" is expressed by the following expression.

[Expression 1]

$$V_t = f_c\left(q_0^c + \frac{q_t}{M_c}\right) - f_a\left(q_0^a + \frac{q_t}{M_a}\right) + RI_a \quad (1)$$

"$I_t$" represents a current value at time "t", and "$q_t$" represents a charge amount of the secondary battery at time "t". "$f_c$" represents a function showing the relationship between the charge amount and the potential of the positive electrode, and "$f_a$" represents a function showing the relationship between the charge amount and the potential of the negative electrode. "$q_o^c$" represents the initial charge amount of the positive electrode, and "$M_c$" represents the mass of the positive electrode. "$q_o^a$" represents the initial charge amount of the negative electrode, and "$M_a$" represents the mass of the negative electrode. "R" represents the internal resistance.

As the current value "$I_t$", the current data recorded by the charge/discharge history recorder 251 is used. The charge amount $q_t$ is calculated by time-integrating the current value "$I_t$". The functions "$f_c$" and "$f_a$" are assumed to be stored as function information in the storage 24.

Five values (a parameter set), the initial charge amount "$q_o^c$" of the positive electrode, the mass "$M_c$" of the positive electrode, the initial charge amount "$q_o^a$" of the negative electrode, the mass "$M_a$" of the negative electrode, and the internal resistance "R" are estimated through regression calculation. Incidentally, the active material amount of each of the electrodes may be calculated by regarding the amount as a predetermined ratio of the mass of the electrode.

Figure 4:
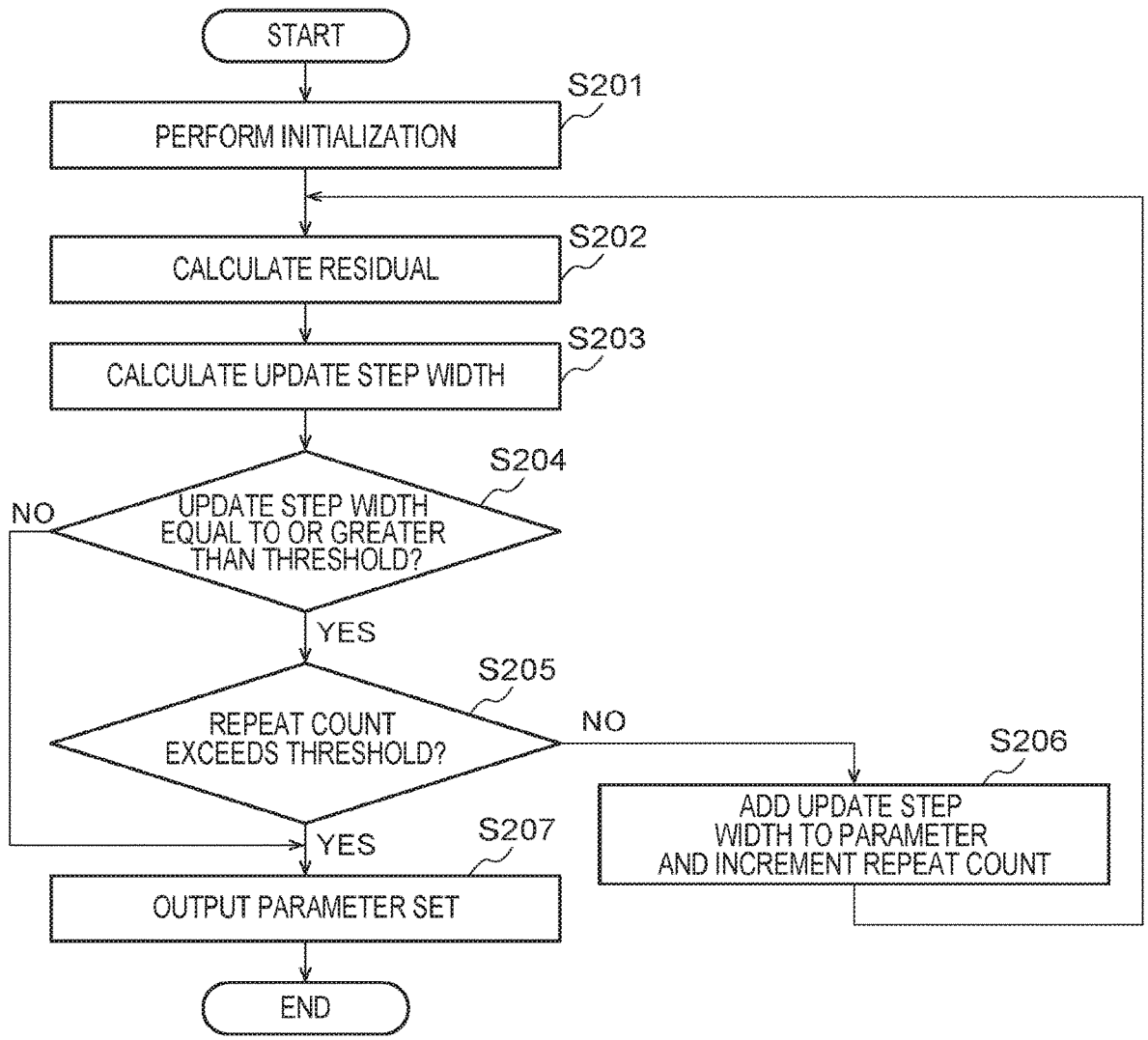
FIG. 4 illustrates an example of a flowchart of a process to be performed by an inner-state parameter calculator.

FIG. 4 illustrates an example of a flowchart of a process to be performed by the inner-state parameter calculator 252. The process to be performed by the inner-state parameter calculator 252 starts after completion of charge of the storage battery 1.

The inner-state parameter calculator 252 performs initialization to set initial values for the aforementioned parameter set and to set the repeat count of regression calculation to zero (S201). The initial value, for example, may be a value calculated when the previous process of calculating the active material amount, or may be an expectable value.

The inner-state parameter calculator 252 calculates a residual E which is expressed by the following expression (S202).

[Expression 2]

$$E = \sum_{t=0}^{t_{end}} (V_{bat\_t} - V_t)^2 \downarrow \quad (2)$$

$$= \sum_{t=0}^{t_{end}} \left(V_{bat\_t} - \left(f_c\left(q_0^c + \frac{q_t}{M_c}\right) - f_a\left(q_0^a + \frac{q_t}{M_a}\right) + RI_t\right)\right)^2$$

wherein "$V_{bat\_t}$" represents the terminal voltage at time "t", and "$t_{end}$" represents a charge end time.

The inner-state parameter calculator 252 calculates an update step width of the parameter set (S203). The update step width of the parameter set can be calculated by method, such as a Gauss-Newton method, a Levenberg-marquardt method.

The inner-state parameter calculator 252 determines whether the update step width is less than a predetermined width (S204). When the update step width is less than the predetermined width (No at S204), the inner-state parameter calculator 252 determines that the calculation has converged, and outputs the present parameter set (S207). When the update step width is equal to or greater than a predetermined threshold (Yes at S204), whether the repeat count of regression calculation is greater than a predetermined value is checked (S205).

When the repeat count of regression calculation is greater than the predetermined value (Yes at S205), the present parameter set is outputted (S207). When the repeat count of regression calculation is equal to or less than the predetermined value (No at S205), the update step width calculated at S203 is added to the parameter set and the repeat count of regression calculation is incremented by one (S206). Subsequently, the process returns to calculation of the residual (S202). The flowchart illustrating the flow of the process to be performed by the inner-state parameter calculator 252 has been described above.

In the present embodiment, a charge history is used as an input to the inner-state parameter calculator 252. However, a discharge history may be used to similarly calculate an active material amount. Incidentally, in the case where a discharge history is used, the process flow to be performed by the inner-state parameter calculator 252 and parameters to be used may be same as those in the case where a charge history is used to calculate the active material amount.

The battery characteristic calculator 253 calculates the open circuit voltage which is a battery characteristic of the storage battery 1. Further, the battery characteristic calculator 253 calculates the relationship between the charge amount of the storage battery 1 and the open circuit voltage by using the initial charge amount "$q_o^c$" of the positive electrode, the mass "$M_c$" of the positive electrode, the initial charge amount "$q_o^a$" of the negative electrode, and the mass "$M_a$" of the negative electrode calculated by the inner-state parameter calculator 252.

Figure 5:
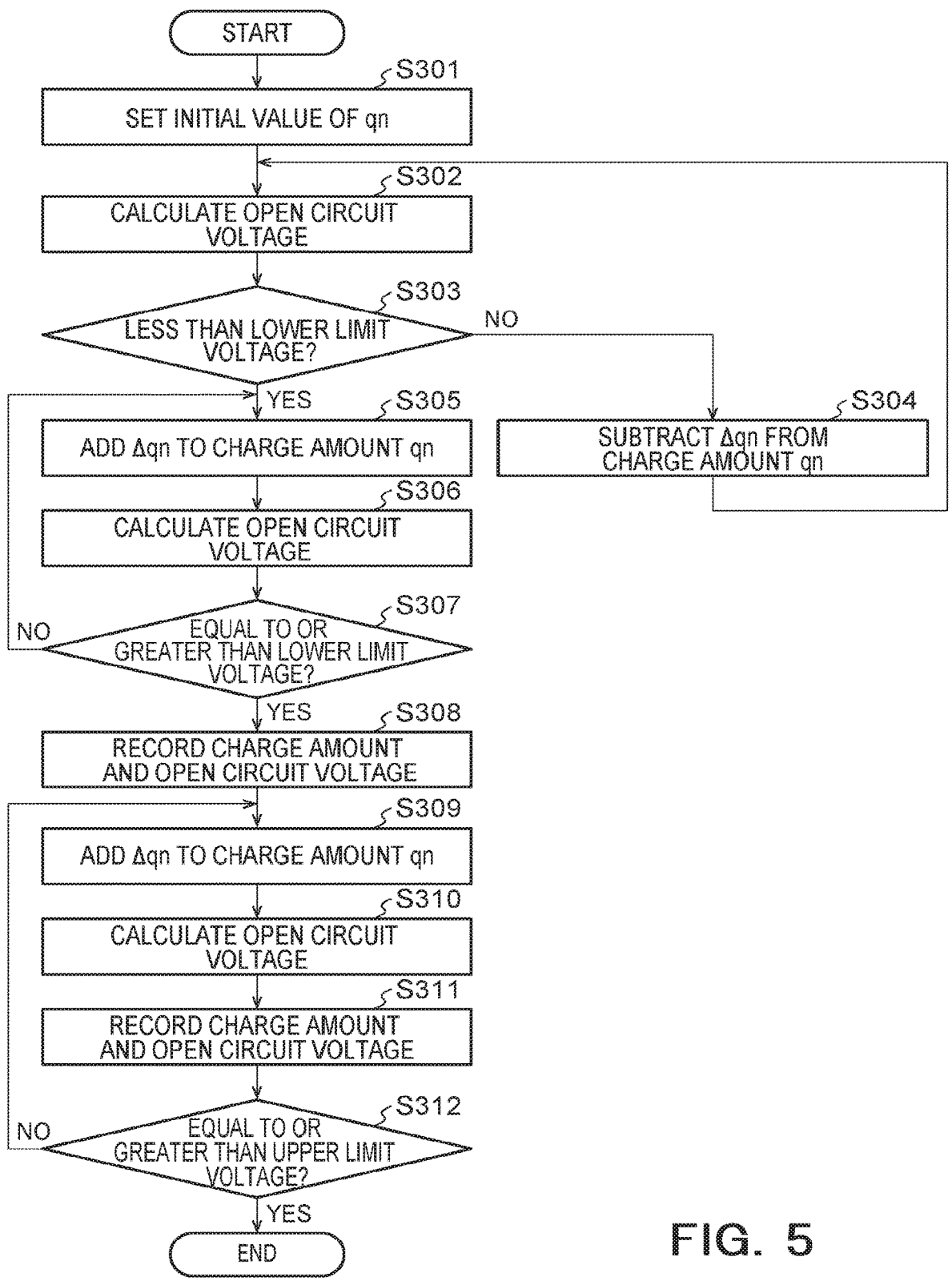
FIG. 5 illustrates an example of a flowchart of a process flow to be performed by a battery characteristic calculator.

FIG. 5 illustrates an example of a flowchart of a process flow to be performed by the battery characteristic calculator 253. The flowchart starts after the process performed by the inner-state parameter calculator 252 is ended. In this flowchart, the charge amount $q_n$ is increased and decreased by a predetermined value $\Delta q_n$, the charge amount $q_{n0}$ is found at which the open circuit voltage exceeds the lower limit, and $q_n$ is increased by $\Delta q_n$ from $q_{n0}$ as an initial value until the open circuit voltage exceeds the upper limit, and the charge amount and the open circuit voltage are recorded every time the increase is performed. Accordingly, the relationship between the charge amount and the open circuit voltage in a range from the lower limit to the upper limit of the open circuit voltage can be calculated. The difference between the charge amount $q_{n0}$ and the charge amount $q_n$ at which the open circuit voltage is the upper limit is a battery capacity.

The battery characteristic calculator 253 sets the initial value of the charge amount $q_n$ (S301). The initial value of $q_n$ may be set to zero or to a value which is less than zero by a few percent of the nominal capacity of the storage battery 1. Specifically, if the nominal capacity of the storage battery 1 is 1000 mAh, the initial value of $q_n$ may be set within a range of approximately −50 mAh to 0 mAh.

The battery characteristic calculator 253 calculates the open circuit voltage (S302). To calculate the open circuit voltage, the following expression can be used.

[Expression 3]

$$E_n = f_c\left(q_0^c + \frac{q_n}{M_c}\right) - f_a\left(q_0^a + \frac{q_n}{M_a}\right) \quad (3)$$

Next, the battery characteristic calculator 253 compares the calculated open circuit voltage with a predetermined storage battery lower limit voltage (S303). The storage battery lower limit voltage is defined on the basis of combination of the positive electrode active material and the negative electrode active material used in the storage battery 1. Specifically, in terms of each of the safety, the lifetime, the resistance, or the like, the appropriate usage ranges of the voltage for the positive electrode active material and the negative electrode active material are defined, and the combination of the ranges is used to determine the lower limit and the upper limit of the usage range for the storage battery.

When the open circuit voltage is not less than the predetermined lower limit voltage (No at S303), $\Delta q_n$ is subtracted from the charge amount $q_n$ (S304) and the open circuit voltage is calculated again (S302). When the open circuit voltage is less than the predetermined lower limit voltage (Yes at S303), the battery characteristic calculator 253 adds $\Delta q_n$ to the charge amount $q_n$ (S305). In this way, the charge amount $q_n$ approximates to the lower limit value. A value of $\Delta q_n$ can be freely determined. For example, $\Delta q_n$ may be set to approximately 1/1000 to 1/100 of the nominal capacity of the storage battery 1. Specifically, if the nominal capacity of the storage battery 1 is 1000 mAh, $\Delta q_n$ may be set to a range of approximately 1 mAh to 10 mAh.

The battery characteristic calculator 253 calculates the open circuit voltage by using the added charge amount $q_n+\Delta q_n$ (S306). Subsequently, the battery characteristic calculator 253 compares the calculated open circuit voltage with the aforementioned lower limit voltage (S307). When the open circuit voltage is lower than the lower limit voltage (No at S307), the process returns to S305 and $\Delta q_n$ is added to the charge amount $q_n$ again (S305). When the open circuit voltage is equal to or higher than the lower limit voltage (Yes at S307), the charge amount $q_n$ at that time is set to $q_{n0}$ because the open circuit voltage has exceeded the lower limit value, and the charge amount $q_{n0}$ and the open circuit voltage En are recorded together (S308). Incidentally, the value of the charge amount $q_{n0}$ may be set as a reference value and expressed by "0". In this case, the value obtained by subtracting the value of $q_{n0}$ from the value of the charge amount $q_n$, in subsequent recording.

The battery characteristic calculator 253 adds $\Delta q_n$ to the charge amount $q_n$ (S309), calculates the open circuit voltage (S310), and records the calculated open circuit voltage En and the value obtained by subtracting $q_{n0}$ from the charge amount $q_n$ (S311).

The battery characteristic calculator 253 compares the calculated open circuit voltage with the predetermined upper limit voltage of the storage battery 1 (S312). The upper limit voltage of the storage battery 1 is defined on the basis of combination of the positive electrode active material and the negative electrode active material used in the storage battery 1. When the open circuit voltage is lower than the predetermined upper limit voltage (No at S312), the process returns to adding of $\Delta q_n$ to the charge amount again (S309). When the open circuit voltage is equal to or higher than the predetermined upper limit voltage (Yes at S312), the process is ended. The flowchart illustrating the process flow to be performed by the battery characteristic calculator 253 has been described.

Figure 6A:
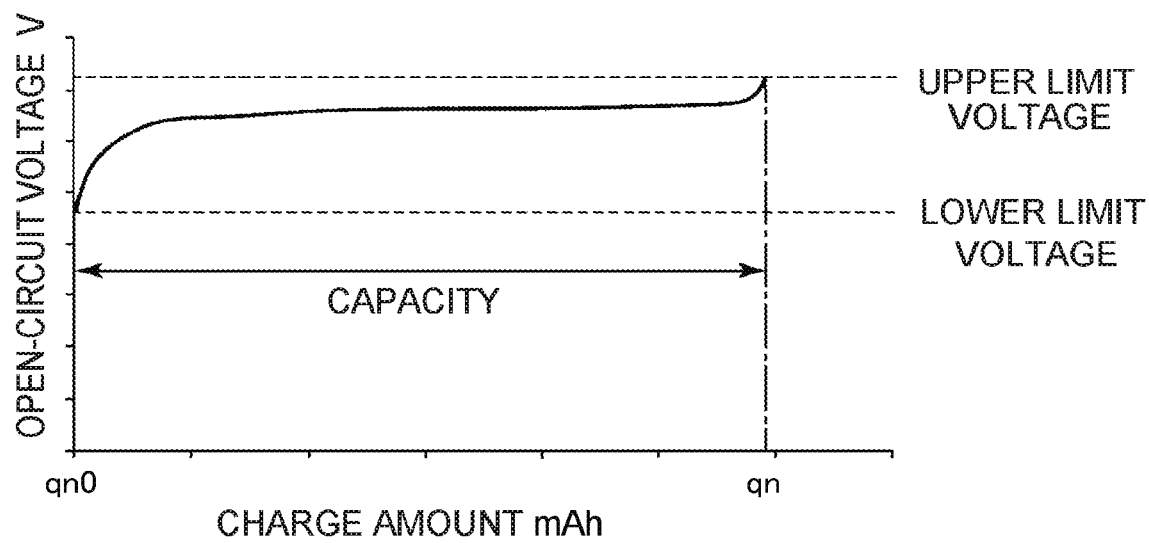
FIGS. 6A and 6B illustrate an example of graphs (charge amount-OCV curves) illustrating the relationships between a charge amount and an open circuit voltage.
Figure 6B:
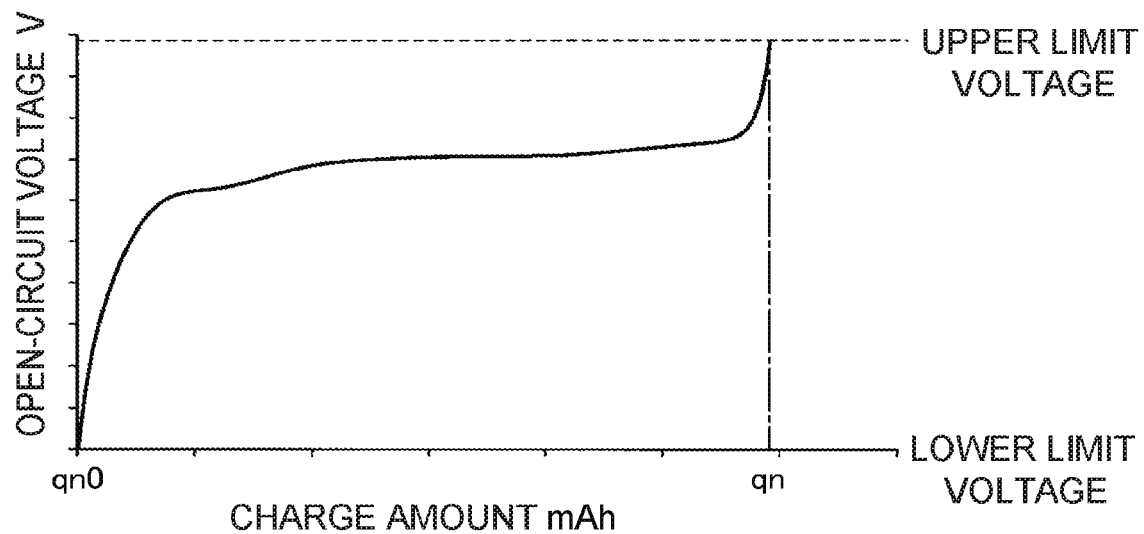

FIGS. 6A and 6B illustrate an example of graphs (charge amount-OCV curves) illustrating the relationships between a charge amount and an open circuit voltage. FIG. 6A illustrates a charge amount-OCV curve at the present state obtained by the battery characteristic calculator 253. FIG. 6B is a diagram obtained by taking out a range from the lower limit voltage to the upper limit voltage of the ordinate, from the graph illustrated in FIG. 6A.

Figure 7:
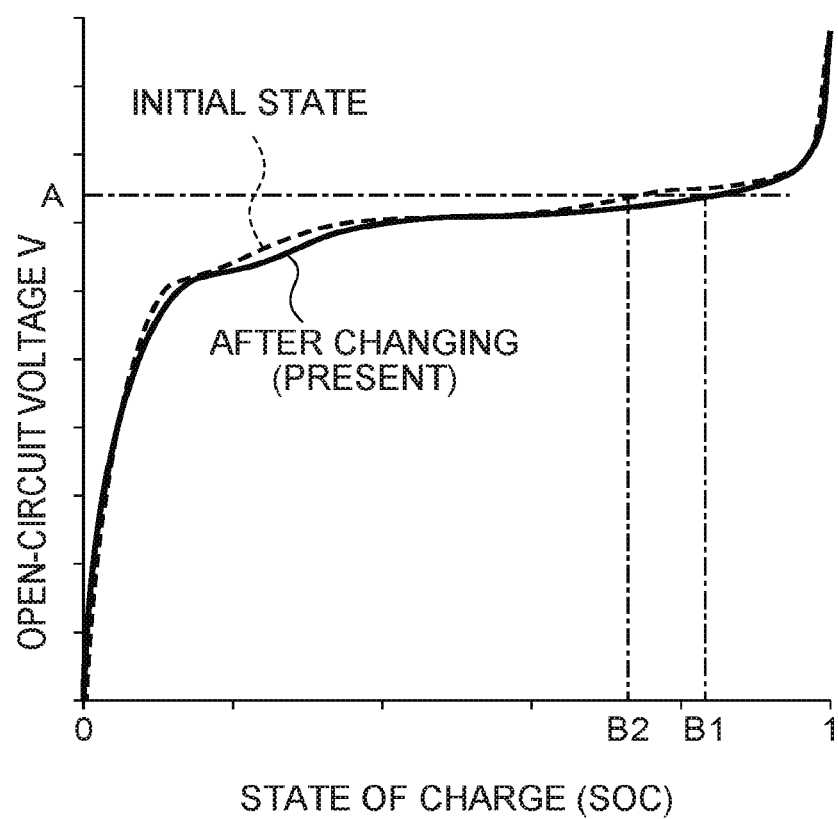
FIG. 7 illustrates an example of a graph (an SOC-OCV curve) illustrating the relationship between an SOC and an open circuit voltage.

FIG. 7 illustrates an example of a graph (an SOC-OCV curve) illustrating the relationship between an SOC and an open circuit voltage. FIG. 7 differs from FIGS. 6A and 6B in that the abscissa in FIG. 7 indicates not the charge amount but the SOC. In FIG. 7, a graph (a solid line) obtained by converting the graph illustrated in FIG. 6B into a SOC-OCV curve and the SOC-OCV curve (a broken line) of the storage battery at the initial state are overlapped. In FIG. 7, the broken line represents the open circuit voltage of the storage battery at the initial state, and the solid line represents the open circuit voltage of the storage battery after change (present time) due to deterioration of the storage battery or the like. The SOC indicates the ratio of the present charge amount with respect to the full charge capacity, and is expressed by a value from 0 to 1, or 0 to 100%.

The charge amount may be converted into an SOC by using the battery capacity and the charge amount calculated from the charge amount-OCV curve. In the description herein, the simple term "charge state" includes not only the SOC but also the charge amount and the like.

The length of the curve after change becomes shorter as the capacity decreases. However, FIG. 7 illustrates that not only the length but also the shape of the curve changes. For example, in the case where the state of charge (SOC) is estimated on the basis of the open circuit voltage, when the measured open circuit voltage is A, the normal charge state (the present state of charge) is B1. However, if the curve of the open circuit voltage is considered not to change, that is, if the open circuit voltage is to be obtained from the SOC-OCV curve at the initial state, B2 is obtained as the charge state at the voltage A, and thus, efficiency in estimation of the charge state is deteriorated. Therefore, as a result of using the SOC-OCV curve at the present state, as in the first embodiment, the charge state can be measured with high accuracy.

The SOC-OCV curve calculated by the battery characteristic estimator 25 may be acquired by the SOC estimator 23 such that the SOC estimator 23 estimates the SOC of the storage battery 1 on the basis of the SOC-OCV curve.

Therefore, according to the first embodiment, it is possible to accurately grasp the relationship (the charge amount-OCV curve or the SOC-OCV curve) which changes with use between the charge amount and the open circuit voltage, without performing special charge and discharge, and thus, the charge state can be highly accurately estimated.

The case where the positive electrode and the negative electrode of the secondary battery are each formed from one kind of an active material has been described herein. However, the present invention can be similarly applied to a secondary battery in which any of the positive electrode and the negative electrode thereof is formed from a plurality of kinds of active materials. Further, in the case where a different storage 24 for storing the active material amounts of the storage battery 1 is prepared in advance, the battery characteristic calculator 253 can calculate a graph showing the relationship between the charge amount and the open circuit voltage of the secondary battery within a predetermined voltage range of the storage battery 1, by using the active material amounts stored in the different storage 24.

The battery characteristic calculator 253 may further calculate other battery characteristics. For example, the battery characteristic calculator 253 may calculate the voltage, the power, and the power amount of the storage battery 1 by using the calculated open circuit voltage or the like. As the calculation method, for example, calculation expressions below may be used. In the following calculation expressions, "c" represents a predetermined constant.

(Voltage)

"voltage"="open circuit voltage"−"$c$"×"internal resistance"×"current";

(Power)

"power"="current"×"open circuit voltage"−"$c$"×"internal resistance"×(current)$^2$ (Power Amount)

"power amount"="battery capacity"×"average voltage"

Incidentally, as the internal resistance, an estimated value calculated by the inner-state parameter calculator 252 may be used, or an estimated value corrected by the internal-resistance corrector 26 may be used. The internal-resistance corrector 26 will be described later. The battery characteristic calculator 253 may recalculate a battery characteristic, which has been calculated, by using the estimation value corrected by the internal-resistance corrector 26. The estimation value corrected by the internal-resistance corrector 26 can further improve the accuracy. The current may be acquired from data measured by the measurer 22. Incidentally, the battery characteristic calculator 253 may receive an expression, a constant value, or the like necessary for the calculation, via the storage 24 or the like.

The internal-resistance corrector 26 corrects, on the basis of a temperature T measured by the measurer 22, the internal resistance R calculated by the battery characteristic estimator 25 to the internal resistance of the storage battery 1 at the present temperature T. The corrected internal resistance is defined as Rcr. In a case where the internal resistance is not corrected, the internal-resistance corrector 26 can be omitted.

Temperature correction of the internal resistance is performed by the internal resistance corrector 26, will be described. The temperature correction of the internal resistance provides, for example, correction of influence of the temperature with respect to a storage battery performance diagnosis method, and expands a temperature range within which storage battery performance diagnosis can be excellently applied. In a battery characteristics diagnosis method, as described in the processing of the battery characteristic estimator 25, the battery capacity, the internal resistance, and the degree of degradation of each of the active materials of each of the positive and negative electrodes are estimated from the charge and discharge curve by reference to the charge amount-OCV data of each of the active materials.

The principle and method of the temperature correction are described. Lithium-ion secondary batteries each include a positive electrode and a negative electrode opposite to each other, and an electrolyte containing a Li salt between the positive and negative electrodes. Active materials are applied onto current collecting foils of the positive and negative electrodes. The current collecting foils are connected to the positive electrode and negative electrode terminals on the storage battery exterior. During charge and discharge of the storage battery 1, Li ions move between the positive electrode active material and the negative electrode active material via the electrolyte so that electrons flow from the active materials to external terminals.

Each of the active materials has a unique potential and a unique amount of Li which can be reversibly inserted or desorbed. An energy quantity which the storage battery 1 can store in a range of a fixed charge and discharge voltage is determined by the amounts of the positive electrode active material and the negative electrode active material in the storage battery 1 and combination thereof.

Further, at the time of charge and discharge, there are caused Li ion conduction, charge transfer resistance due to Li ions in the electrolyte penetrating into the active material, resistance of a film formed on the interface between the electrolyte and the active material, and electrical resistance due to electrons flowing through the active material and the current collection foil. The internal resistance of the storage battery 1 is the sum total of the Li ion transfer resistance, the electron transfer resistance, the charge transfer resistance, the film resistance, and the diffused resistor in the positive electrode and the negative electrode.

Generally, in a storage battery control system in a lithium ion secondary battery, the voltage of each of the unit cells, the temperature in the group battery, and the like, are measured in the viewpoint of safety. If the battery characteristics can be calculated on the basis of such measurement data, cost and time required for calculation can be suppressed.

However, it is very difficult to analyze the behavior of the storage battery during actual use in which a charge and discharge condition finely and randomly varies. The reason for this is that since such a behavior is a phenomenon in which a resistance depending on time, a diffusion resistance, a relaxation process, and the like are complexed in a complicated way, a calculation model therefor is difficult to obtain. In contrast, for example, if only a simply behavior such as charge of an electric vehicle under a predetermined condition is analyzed, the analysis can be performed using a simplified model.

Therefore, in the storage battery performance estimating method according to the present embodiment, values of variables are determined by fitting calculation using, as variables, the amount of each of the active materials, the rise (overvoltage) of the storage battery voltage due to internal resistance at application of charge current, on the basis of an "electric potential-charge amount" curve associated with the Li insertion-elimination reaction of each active material, which is obtained by data (charge-discharge curve) of charge or discharge under fixed conditions. Thereby, it is possible to estimate the capacity reduction (reduction of each active material) and the increase in internal resistance.

Figure 8:
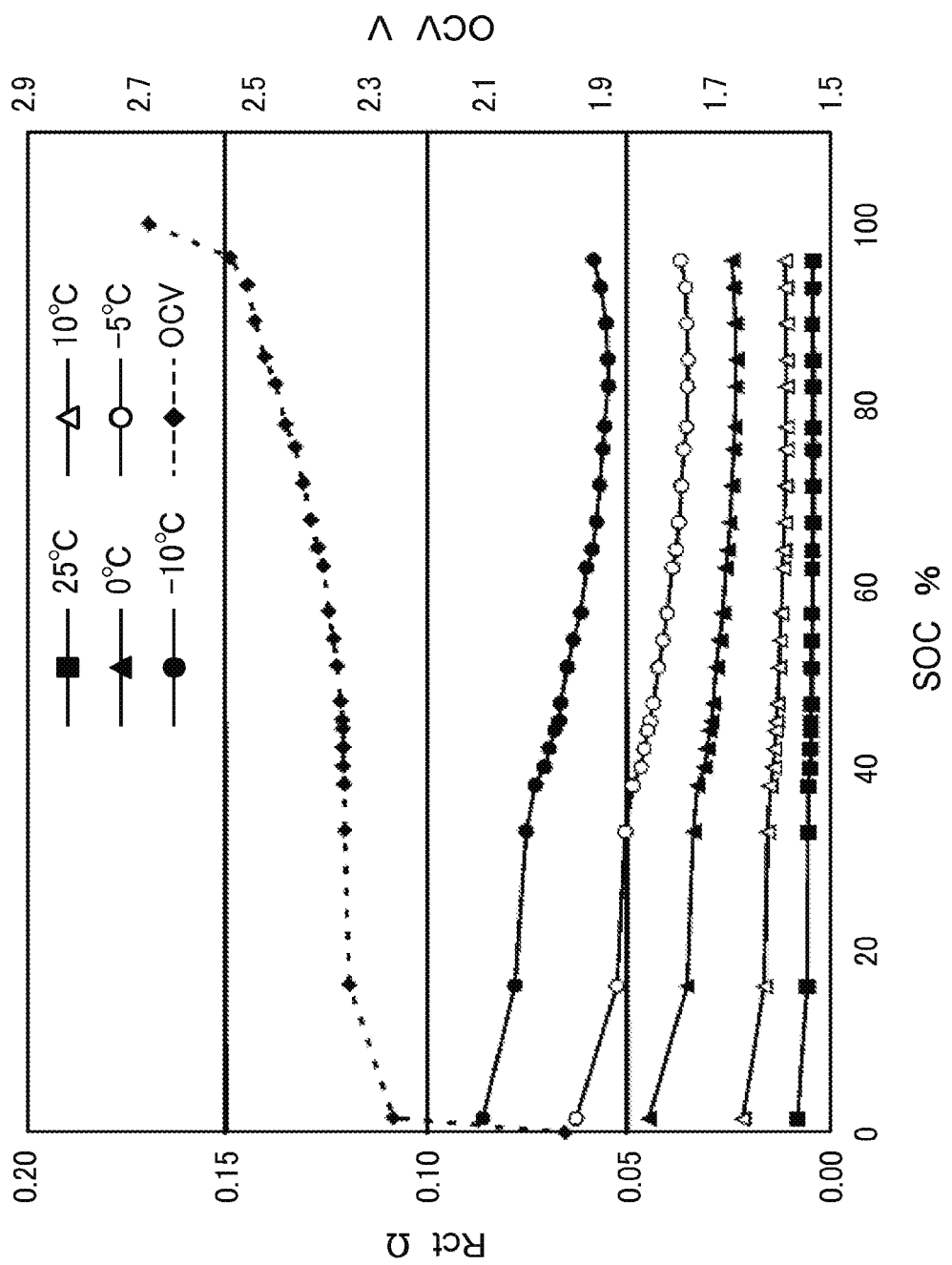
FIG. 8 illustrates an example of the relationships, at respective temperatures, between SOCs and reaction resistances Rct.

However, under an actual use situation of a storage battery, a temperature condition varies according to an external environment, the state of the storage battery during charge and the like. When the temperature of the storage battery changes, the performance of the storage battery changes. In particular, the internal resistance increases greatly depending on reduction in temperature. FIG. 8 illustrates an example of the relationships, at respective temperatures, between SOCs and reaction resistances Rct. A reaction resistance Rct is one of internal resistance components. As illustrated in FIG. 8, reaction resistances differ greatly according to difference in temperature. Accordingly, even if the analysis results of measurement data of different temperatures are compared with one another, it is difficult to evaluate the increase in internal resistance due to deterioration because the results are greatly influenced by variation in analysis result caused by temperatures.

Accordingly, when the battery characteristics are estimated on the basis of measurement data about the storage battery actually being used, performing temperature correction on the internal resistance improves accuracy of estimating the battery characteristics.

Internal resistances of the storage battery are composed of a plurality of types of resistance components. The resistance components differ from one another in temperature dependency and increase speed due to deterioration. For this reason, with progress of deterioration, the ratio of the resistance changes, and accordingly, the temperature dependency of the internal resistance as a whole also changes. In view of this point, in temperature correction of internal resistances in the storage battery performance estimating method according to the present embodiment, internal resistances are divided into three components, which are a reaction resistance "Rct", a diffusion resistance "Rd", and an ohmic resistance "Rohm". The components are corrected to values corresponding to a reference temperature "T0", in accordance with the respective unique temperature dependencies, and then, are summed up.

Specifically, the storage battery temperature at the time of measurement is corrected to the reference temperature by mathematical expressions below. In the expressions below, "Rgas" represents a gas constant, "T0" represents the reference temperature, T represents the storage battery temperature at the time of measurement, "R1" represents a constant, and "Ea", "Eb", and "Ec" each represent a constant for determining the temperature dependency of the corresponding resistance component.

(Reaction Resistance)

$$Rct(T0)=Rct(T)\times Exp(-Ea/(Rgas\cdot T))/Exp(-Ea/(Rgas\cdot T0))$$

(Diffusion Resistance)

$$Rd(T0)=Rd(T)\times Exp(-Eb/(Rgas\cdot T))/Exp(-Eb/(Rgas\cdot T0))$$

(Ohmic Resistance)

$$Rohm(T0)=(Rohm(T)-R1)\times Exp(-Ec/(Rgas\cdot T))/Exp(-Ec/(Rgas\cdot T0))+R1$$

Figure 9:
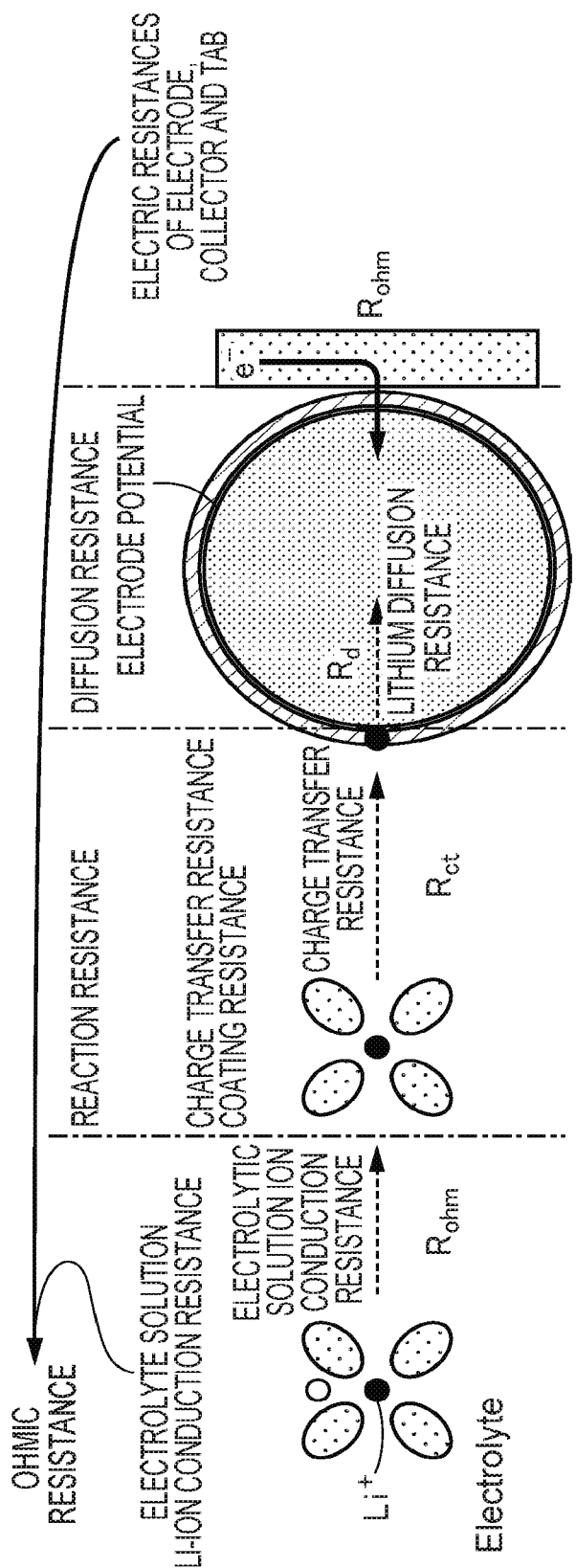
FIG. 9 is a diagram regarding resistive components.
Figure 10A:
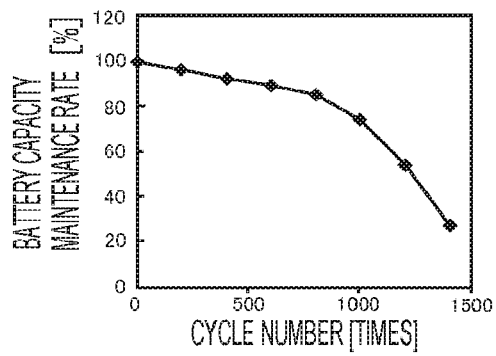
FIGS. 10A to 10E are diagrams exemplarily illustrating material safety data.
Figure 10B:
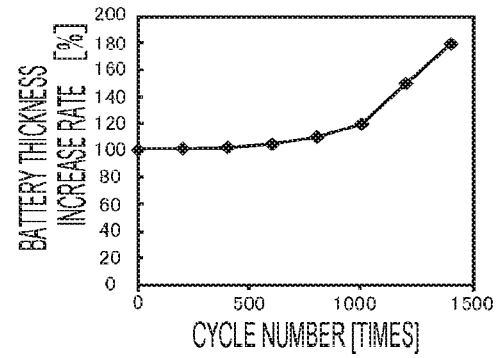
Figure 10C:
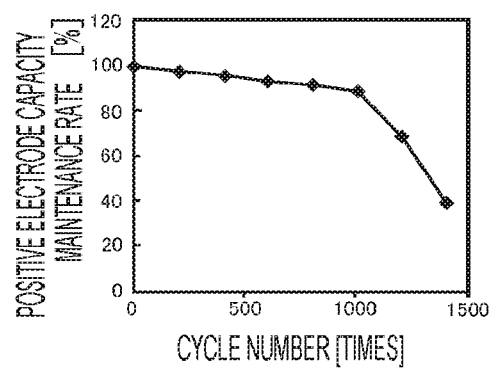
Figure 10D:
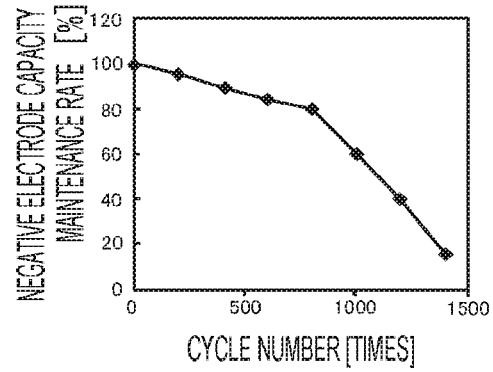
Figure 10E:
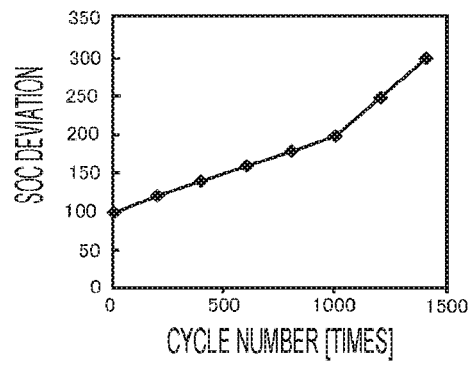

FIG. 9 is a diagram regarding the resistance components. The ohmic resistances include an ion conduction resistance in an electrolyte and an electron conduction resistance in the storage battery. The electron conduction resistance which has a low temperature dependency is a constant. The reaction resistances include a charge transfer resistance and the resistance of a surface coating. The diffusion resistances include resistances associated with diffusion of lithium ions inside the active materials and the electrodes.

"Ec" of the ohmic resistance represents an active energy associated with transfer of Li ions in the electrolyte. "Ea" of the reaction resistance represents an energy generated when Li ions solvated in the electrolyte are removed on an active material surface. "Eb" of the diffusion resistance is considered as an active energy associated with transfer of Li ions between sites in an active material. Accordingly, the above values can be considered as constant values which are not changed in the deterioration process.

The values "Ea", "Eb", and "Ec" can be calculated by measuring the AC impedances, or the current pulses of unit cells, for example. The values "Ea", "Eb", and "Ec" about the storage battery to be analyzed are calculated from measurement values, and stored in the storage 24, in advance. The values may be referred in temperature correction calculation of the internal resistances.

A method of estimating the battery characteristics from the charge and discharge curve by dividing the internal resistances into three types of components is described.

In the deterioration process of the storage battery, all of the three components of the internal resistances increase, but the increase speeds due to the deterioration differ from one another. Accordingly, the assumption that deterioration does not occur may be established as a result of limiting the lifetime range of the storage battery to be evaluated. For example, in a storage battery for electric vehicles for which the evaluation lower limit is assumed to be the residual capacity of approximately 90 to 70%, some of the resistance components can be approximated to a fixed value throughout the storage battery lifetime, although the use condition, the configuration of the storage battery, and the like can have some influences.

(First Method)

In a first method for calculating the three components from the calculated internal resistance values of the storage battery, the ohmic resistance component and the diffusion resistance component are considered to be fixed, and the residual is considered as the reaction resistance. This method assumes that deterioration does not cause increase in the ohmic resistance component and the diffusion resistance component, and considers only temperature change which depends on a cell temperature. In analysis of a charge and discharge curve, the ohmic resistance component and the diffusion resistance component at the temperature T are subtracted from the internal resistance value estimated for the temperature T, and the remainder is regarded as the reaction resistance component. The components are subjected to temperature correction to the reference temperature T0, and summed up, so that the internal resistance values at the reference temperature T0 are calculated. The first method is suitable for moderate usage, in which, for example, the SOC falls within a range in which the active materials of the positive and negative electrodes are stable, the temperature is equal to or lower than the approximate room temperature, and the current of the storage battery is relatively small.

(Second Method)

In a second method, the ohmic resistance component and the diffusion resistance component are estimated by a function regarding the relationship between the two resistance components and an accumulated time or accumulated power amount, and the residual is regarded as the reaction resistance. This method calculates the ohmic resistance component and the diffusion resistance component, while assuming that deterioration in the ohmic resistance component and the diffusion resistance component correlates with a time or a cycle amount of charge and discharge. In analysis of a charge and discharge curve, the calculated ohmic resistance component and the calculated diffusion resistance component are subtracted from the internal resistance value estimated for the certain temperature T, and the remainder is regarded as the reaction resistance component. The components are subjected to temperature correction to the reference temperature $T0$, and summed up, so that the internal resistance values at the reference temperature $T0$ are calculated. The second method is suitable for a case where deterioration in the ohmic resistance component and the diffusion resistance component is relatively small, but actually progresses.

Which of an accumulated time and an accumulated power amount is used may be determined according to the use environment or the like. For example, for a case where deterioration of the storage battery progresses due to generation of gas during preservation, deterioration amount estimation using an accumulated time is suitable. In contrast, for a case where deterioration of the storage battery, such as change in volume of the active materials, is remarkable due to repetition of a process cycle such as charge and discharge, deterioration amount estimation using an accumulated power amount is suitable.

Incidentally, data on an accumulated time or an accumulated power amount is assumed to be held in advance. The accumulated power amount may be replaced with an operation amount of a device, such as the travel distance of a vehicle, for example.

(Third Method)

In a third method, a reaction resistance component and a diffusion resistance component are estimated from data on the diffusion resistances and the charge amounts of the respective materials which are held in advance or data on the reaction resistances and the charge amounts of the respective materials which are held in advance, and the residual is regarded as an ohmic resistance component. In the third method, unlike the first and second methods, the values of the reaction resistance and the diffusion resistance are estimated by performing regression calculation, in analysis of the charge and discharge curve, with reference to the reaction resistance-charge amount curve of an active material, the diffusion resistance-charge amount curve of an active material, or the internal resistance-charge amount curve of the storage battery. By using the fact that the resistance component of an active material has a dependency on the charge amount, that is, the SOC, and that the tendency of the dependency does not change even after deterioration, the compositions of the internal resistance are estimated from the tendency of internal resistance-charge amount of the storage battery.

A reaction resistance-charge amount curve and a diffusion resistance-charge amount curve of an active material need to be measured in advance. The form of change due to deterioration, which depends on the configuration of the storage battery, needs to be measured in advance. For example, it is considered that, when a resistive surface film is formed, the resistance is uniformly increased by a constant value according to the formation of the film, and that, when the active material is decreased, the resistance is uniformly increased by n-times according to the decrease.

The third method is suitable for a case where the reaction resistance-charge amount remarkably changes, and as a result, the reaction resistances of the storage battery clearly have a dependency on the charge amount.

(Fourth Method)

In a fourth method, regression calculation is performed using data of each active material which is held in advance and is on the diffusion resistance-charge amount, the reaction resistance-charge amount, and the ohmic resistance-charge amount, so that the reaction resistance component, the ohmic resistance component, and the diffusion resistance component are estimated. In the third method, only the diffusion resistance-charge amount and the reaction resistance-charge amount are used. However, in the fourth method, data on the ohmic resistance-charge amount is further used. The fourth method is effective for a case where the dependency of an active material on the ohmic resistance-charge amount is characteristic, for example, a case where the electron conductivity of the active material greatly changes due to charge or discharge.

The battery characteristic calculator 253 may calculate, as the battery characteristics, the power amount or the like which can be actually outputted by using the corrected internal resistances. The power amount which can be actually outputted can be calculated on the basis of the charge amount-OCV curve, the dischargeable power amount, and the corrected internal resistances.

The battery safety evaluator 27 calculates the battery swelling index of the storage battery 1 from the present inner state parameter or battery characteristic which is estimated by the battery characteristic estimator 25. Then, it evaluates the swelling risk of the storage battery 1 under the supposed condition of use in the future. Details thereof will be described with description of the components of the battery safety evaluator 27.

By using the present inner state parameters or battery characteristics, the battery swelling risk in accordance with the present inner state (deterioration state) of the storage battery 1 can be evaluated. It should be noted that even for the same deterioration states, their risks are different from each other depending on the supposed condition of use of the storage battery 1 in the future. Specifically, the supposed condition of use is a constraint condition used in use of the storage battery 1, that is, in charging/discharging the storage battery 1. The conditions of use may contain, for example, a voltage width, an SOC range, a current width (width of a charge/discharge current value or a charge/discharge rate), a power width, a temperature width and the like in its use. Incidentally, while any of the width and the range means being between its upper limit and its lower limit, the upper limit and the lower limit may be the same. Namely, the condition of use may be one value. Moreover, any one of the upper limit and the lower limit may be defined without the other defined. For example, a condition of use may be that a current in charging is not more than 10 A.

The material safety data storage 271 stores material safety data needed in calculating the swelling risk of the storage battery 1. Incidentally, data other than the material safety data may be stored therein. For example, the material safety data storage 271 may store constraint conditions used for the processes of the battery safety evaluator 27, such, for example, as the SOC range applied to the storage battery 1 as a condition of use. The calculated battery swelling index and the like may be stored therein.

The material safety data is data regarding battery swelling of a secondary battery in the case where the secondary battery is used. The material safety data at least indicates relationship between the battery swelling and the inner state parameter of the secondary battery.

The material safety data may be expressed as a graph or a function. For example, the material safety data may be a graph indicating relationship between the positive electrode capacity of a secondary battery and a thickness increase of the secondary battery. Moreover, an approximation function of the graph may be used as the material safety data.

The material safety data is supposed to be categorized for the individual electrodes of the secondary battery. Namely, the material safety data may include material safety data pertaining to the positive electrode of the secondary battery, and material safety data pertaining to the negative electrode of the secondary battery. Furthermore, it may include material safety data regarding a state of combination of the positive electrode and the negative electrode of the secondary battery, and an SOC deviation thereof.

FIGS. 10A to 10E exemplarily illustrate diagrams of the material safety data. FIGS. 10A to 10E illustrate graphs in which the material safety data are plotted. As illustrated in FIGS. 10A to 10E, a graph regarding the material safety data is expressed as material safety graph. The data in FIGS. 10A to 10E illustrate graphs in which a battery capacity maintenance rate (FIG. 10A), a battery thickness increase rate (FIG. 10B), a positive electrode capacity maintenance rate (FIG. 10C), a negative electrode capacity maintenance rate (FIG. 10D) and an SOC deviation (FIG. 10E) are plotted versus cycle times when a cycle test of a lithium ion secondary battery in which the positive electrode active material is lithium cobaltate and the negative electrode active material is graphite is performed at 1 C of charge/discharge rate under an environmental condition of 25° C. As described above, the material safety data exists for each of the electrode materials, the temperature and the control conditions.

The material safety data is created on the basis of measurement data of a plurality of secondary batteries. The plurality of secondary batteries used for creating the material safety data are supposed to be secondary batteries which satisfy certain prerequisite conditions. Then, the material safety data is versatilely used for other secondary batteries which satisfy the prerequisite conditions.

The prerequisite conditions are not specially limited but there are various prerequisite conditions. For example, such prerequisite conditions may be materials used for positive electrodes and negative electrodes of secondary batteries, active material amounts of the positive electrodes and the negative electrodes being within predetermined ranges, and the similar factors. Then, a plurality of secondary batteries which satisfy the prerequisite conditions are inspected, and then the material safety data is calculated on the basis of inspection results. Incidentally, a method of creating the material safety data is not specially limited but may be arbitrarily defined.

Otherwise, an unused state, a state where metal is deposited, and the similar state may be regarded as prerequisite conditions. Alternatively, a matter regarding a preservation or use environment of a secondary battery may be regarded as a prerequisite condition. As a prerequisite condition regarding the environment, the temperature, the humidity, or the like may be used. For example, also a matter regarding the use history of a secondary battery may be used as a prerequisite condition. As a prerequisite condition regarding the use history, the number of performing charge and discharge, the total use time, or the like may be used.

As the causes of deterioration of a secondary battery, the reactivity with an electrolyte, a damage due to expansion or contraction of an active material or the like may be expected. However, specifying the cause of deterioration of a secondary battery is difficult. The deterioration condition varies according to the storage condition, the use history, or the like of a secondary battery. Therefore, material safety data is beforehand calculated for each of various prerequisite conditions, and the material safety data matching the state of the storage battery 1 is used. In other words, the material safety data calculated on the basis of the inspection result of a secondary battery in the similar state to the state of the storage battery 1 is used. Thereby, the battery swelling index of the storage battery 1 can be estimated with excellent accuracy.

The material safety data acquirer 272 acquires the estimation value regarding at least any of the inner state parameter and the battery characteristic from the battery characteristic estimator 25. Then, the material safety data acquirer 272 acquires material safety data (first reference data) corresponding to the storage battery 1 from the material safety data storage 271 at least on the basis of the acquired estimation value. In other words, the material safety data acquirer 272 extracts the material safety data corresponding to the storage battery 1 out of the material safety data of secondary batteries.

Incidentally, it is supposed that the material safety data corresponding to the storage battery 1 includes material safety data corresponding to the positive electrode of the storage battery 1, material safety data corresponding to the negative electrode of the storage battery 1, and material safety data corresponding to the SOC deviation of the storage battery 1. In other words, the material safety data acquirer 272 may acquire the material safety data corresponding to the positive electrode on the basis of the estimation value regarding the positive electrode. It may acquire the material safety data corresponding to the negative electrode on the basis of the estimation value regarding the negative electrode. It may acquire the material safety data corresponding to the SOC deviation on the basis of the estimation value regarding the SOC deviation. For example, the material safety data may be acquired on the basis of the initial charge amount of the positive electrode or the negative electrode calculated as an inner state parameter. For example, the material safety data may be acquired on the basis of the mass of the positive electrode or the negative electrode calculated as an inner state parameter. For example, the material safety data may be acquired on the basis of the open circuit voltage calculated as a battery characteristic.

When the estimation value of the storage battery 1 satisfies the prerequisite condition of a secondary battery in the occasion of beforehand creating the material safety data, the relevant material safety data can be regarded as corresponding to the storage battery 1. For example, in the case where the material safety data has been created on the basis of a plurality of secondary batteries satisfying a prerequisite condition that the active material amount of the positive electrode is within a predetermined range, when the estimation value on the active material amount of the positive electrode of the storage battery 1 is within the predetermined range, the relevant material safety data can be regarded as corresponding to the storage battery 1. Moreover, the material safety data corresponding to the storage battery 1 can be regarded as material safety data suitable for calculating the battery swelling index of the storage battery 1.

Incidentally, as mentioned above, the material safety data is categorized for the prerequisite conditions. Therefore, the material safety data acquirer 272 acquires the material safety data matching a specified prerequisite condition out of the material safety data corresponding to the storage battery 1.

Incidentally, the material safety data acquirer 272 may acquire the material safety data on the basis of a plurality of estimation values. Material safety data matching a plurality of estimation values is highly possibly material safety data more matching the storage battery 1 than material safety data matching one estimation value. Therefore, in the case of using the material safety data a plurality of estimation values, the accuracy of the calculated battery swelling index and risk evaluation is considered to be improved more than in the case of using the material safety data matching one estimation value.

The battery swelling index calculator 273 calculates the battery swelling index of the storage battery 1 on the basis of the acquired material safety data corresponding to the storage battery 1.

The battery swelling index calculator 273 calculates battery swelling or a calculation value regarding the battery swelling as the battery swelling index.

Next, methods of calculating the battery swelling index are described.

(First Method)

A first method of calculating the battery swelling index of the storage battery 1 on the basis of the acquired material safety data corresponding to the storage battery 1 is a method of calculation from the positive electrode capacity maintenance rate.

Figure 11A:
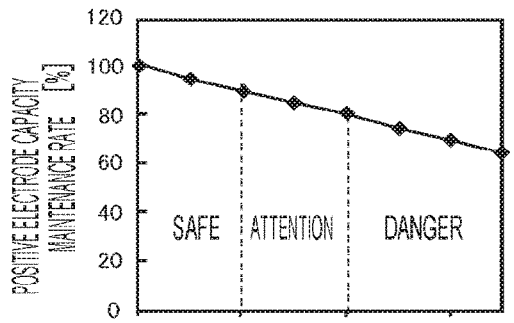
FIGS. 11A to 11H are diagrams exemplarily illustrating methods of calculating a battery swelling index.

An index regarding battery swelling is determined from the positive electrode capacity maintenance rate in accordance with predefined thresholds. FIG. 11A is a diagram exemplarily illustrating calculation of the index regarding battery swelling from the positive electrode capacity maintenance rate. FIG. 11A illustrates a graph obtained by plotting the material safety data. It is understood from FIG. 11A that the battery swelling risk is "safe" in the case where the positive electrode capacity maintenance rate is within a range of 100% to 90%, that it is "attention" in the case of being within a range of 90% to 80%, and that it is "danger" in the case of being within a range less than 80%. The thresholds can be defined, for example, for individual positive electrode materials.

(Second Method)

A second method of calculating the battery swelling index of the storage battery 1 on the basis of the acquired material safety data corresponding to the storage battery 1 is a method of calculation from the negative electrode capacity maintenance rate.

Figure 11B:
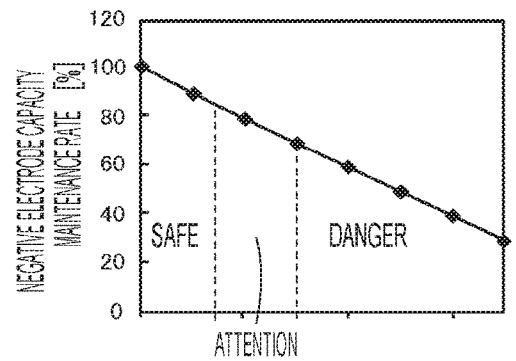

An index regarding battery swelling is determined from the negative electrode capacity maintenance rate in accordance with predefined thresholds. FIG. 11B is a diagram exemplarily illustrating calculation of the index regarding battery swelling from the negative electrode capacity maintenance rate. FIG. 11B illustrates a graph obtained by plotting the material safety data. It is understood from FIG. 11B that the battery swelling risk is "safe" in the case where the negative electrode capacity maintenance rate is within a range of 100% to 85%, that it is "attention" in the case of being within a range of 85% to 70%, and that it is "danger" in the case of being within a range less than 70%. The thresholds can be defined, for example, for individual negative electrode materials.

(Third Method)

A third method of calculating the battery swelling index of the storage battery 1 on the basis of the acquired material safety data corresponding to the storage battery 1 is a method of calculation from the SOC deviation amount.

Figure 11C:
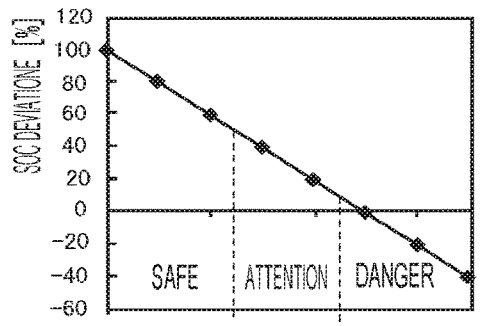
Figure 11D:
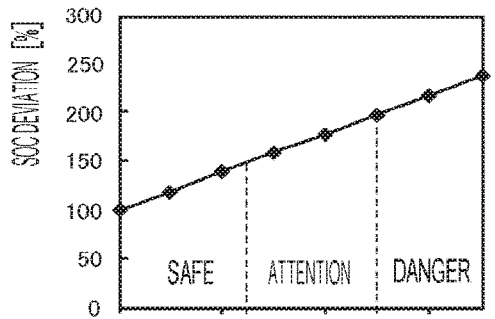

An index regarding battery swelling is determined from the SOC deviation amount in accordance with predefined thresholds. FIGS. 11C and 11D are diagrams exemplarily illustrating calculation of the index regarding battery swelling from the SOC deviation amount. FIGS. 11C and 11D illustrate graphs obtained by plotting the material safety data. It is understood from FIG. 11C, when the SOC deviation amount decreases, that the battery swelling risk is "safe" in the case of being within a range of 100% to 50%, that it is "attention" in the case of being within a range of 50% to 10%, and that it is "danger" in the case of being within a range less than 10%. It is understood from FIG. 11D, when the SOC deviation amount increases, that the battery swelling risk is "safe" in the case of being within a range of 100% to 150%, that it is "attention" in the case of being within a range of 150% to 200%, and that it is "danger" in the case of being within a range more than 200%. The thresholds can be defined, for example, for individual battery materials.

(Fourth Method)

A fourth method of calculating the battery swelling index of the storage battery 1 on the basis of the acquired material safety data corresponding to the storage battery 1 is a method of calculation from a ratio between the capacity maintenance rates of the positive electrode and the negative electrode.

Figure 11E:
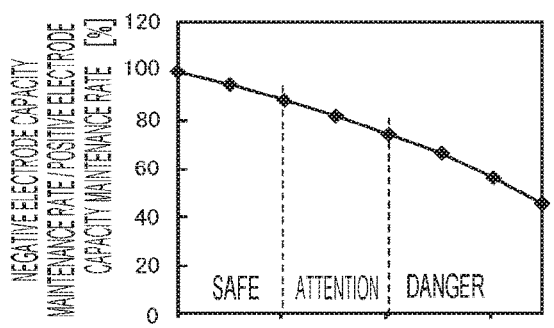
Figure 11F:
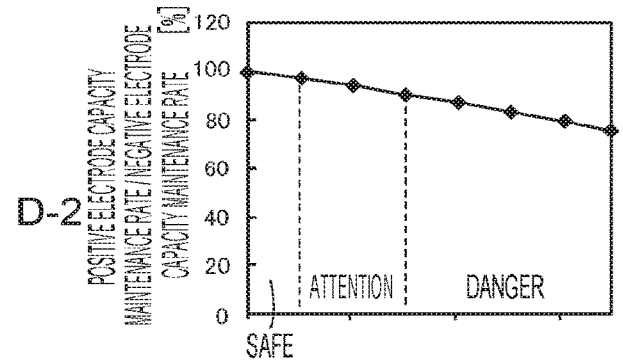

An index regarding battery swelling is determined from the ratio between the capacity maintenance rates of the positive electrode and the negative electrode in accordance with predefined thresholds. FIGS. 11E and 11F are diagrams exemplarily illustrating calculation of the index regarding battery swelling from the ratio between the capacity maintenance rates of the positive electrode and the negative electrode. FIGS. 11E and 11F illustrate graphs obtained by plotting the material safety data. It is understood from FIG. 11E, when "positive electrode capacity maintenance rate">"negative electrode capacity maintenance rate", that the battery swelling risk is "safe" in the case where "negative electrode capacity maintenance rate"/"positive electrode capacity maintenance rate" is within a range of 100% to 85%, that it is "attention" in the case of being within a range of 85% to 75%, and that it is "danger" in the case of being within a range less than 75%. It is understood from FIG. 11F, when "negative electrode capacity maintenance rate">"positive electrode capacity maintenance rate", that the battery swelling risk is "safe" in the case where "positive electrode capacity maintenance rate"/"negative electrode capacity maintenance rate" is within a range of 100% to 95%, that it is "attention" in the case of being within a range of 95% to 85%, and that it is "danger" in the case of being within a range less than 85%. The thresholds can be defined, for example, for individual battery materials.

(Fifth Method)

A fifth method of calculating the battery swelling index of the storage battery 1 on the basis of the acquired material safety data corresponding to the storage battery 1 is a method of calculation from the battery capacity maintenance rate.

Figure 11G:
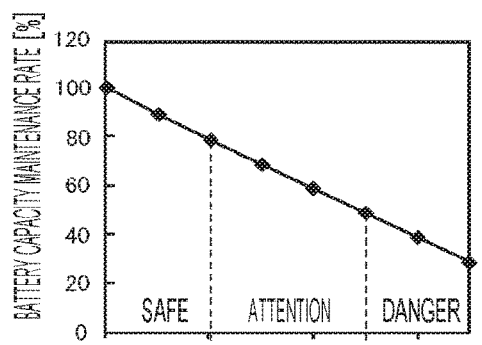

An index regarding battery swelling is determined from the battery capacity maintenance rate in accordance with predefined thresholds. FIG. 11G is a diagram exemplarily illustrating calculation of the index regarding battery swelling from the battery capacity maintenance rate. FIG. 11G illustrates a graph obtained by plotting the material safety data. It is understood from FIG. 11G that the battery swelling risk is "safe" in the case where the battery capacity maintenance rate is within a range of 100% to 80%, that it is "attention" in the case of being within a range of 80% to 50%, and that it is "danger" in the case of being within a range less than 50%. The thresholds can be defined, for example, for individual battery materials.

(Sixth Method)

A sixth method of calculating the battery swelling index of the storage battery 1 on the basis of the acquired material safety data corresponding to the storage battery 1 is a method of calculation from a combination of the first method to the sixth method.

Figure 11H:
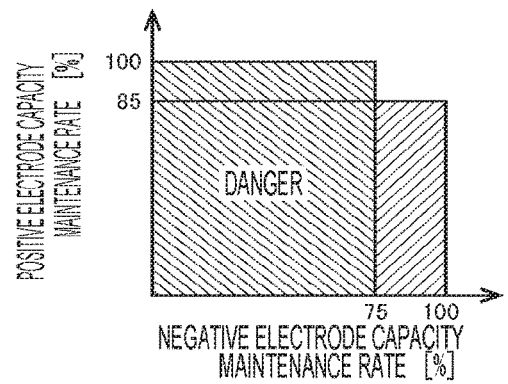

An index regarding battery swelling is determined from an arbitrary combination of the first method to the sixth method in accordance with predefined thresholds. FIG. 11H is a diagram exemplarily illustrating calculation of the index regarding battery swelling from a combination of the first method and the second method. FIG. 11H illustrates a graph obtained by plotting the material safety data. It is understood from FIG. 11H that the battery swelling risk is "safe" in the case where the positive electrode capacity maintenance rate is within a range of 100% to 85%, and that it is "danger" in the case of being within a range less than 85%. Furthermore, it is understood that the battery swelling risk is "safe" in the case where the negative electrode capacity maintenance rate is within a range of 100% to 75%, and that it is "danger" in the case of being within a range less than 75%. Accordingly, it is understood that the battery swelling risk in this case is "safe" in the case of being in other than the hatched portion in the figure, and that it is "danger" in the case of being in the hatched portion. The thresholds can be defined, for example, for individual positive electrode materials.

Incidentally, the methods of calculating the battery swelling index described above are exemplary, not limited to the above methods.

The risk determiner 274 determines the battery swelling risk of the storage battery 1 on the basis of the calculated battery swelling index (by one of the first method to the sixth method). For example, the battery swelling index may be compared with the threshold for the battery swelling index. The threshold for the battery swelling index is expressed as battery swelling threshold. The battery swelling threshold may be predefined.

Incidentally, battery swelling risk evaluation may be two of being safe and not being safe (dangerous) with the battery swelling threshold being as a reference. Otherwise, with a plurality of battery swelling thresholds, the battery swelling risk evaluation may be categorized into a plurality of types (for example, "safe, attention, and danger" or "safe, attention, warning and stop"). For example, as in FIG. 11A, "Safe" may be determined when the positive electrode capacity maintenance rate which is the battery swelling index is higher than a first battery swelling threshold, "attention" may be determined when the positive electrode capacity maintenance rate is not more than the first safety threshold and higher than a second safety threshold, and "danger" may be determined when the positive electrode capacity maintenance rate is not more than the second safety threshold. To categorize the battery swelling risk evaluation into a plurality of types enhances convenience for a user.

Incidentally, the safety index calculated by the battery swelling index calculator 273 may be used as the safety evaluation. In that case, the battery swelling risk determiner 274 may be omitted.

Incidentally, as mentioned above, the battery characteristic estimator 25 can calculate the estimation value of the inner state parameter or the battery characteristic with high accuracy. Furthermore, by recalculating the estimation value of the inner state parameter or the battery characteristic on the basis of the internal resistance corrected by considering the electrolyte, the temperature and the like, the accuracy of the estimation value is enhanced. Since the battery swelling index is determined on the basis of the material safety data extracted with that highly accurate estimation value, the accuracy of battery swelling risk determination also becomes high.

Figure 12:
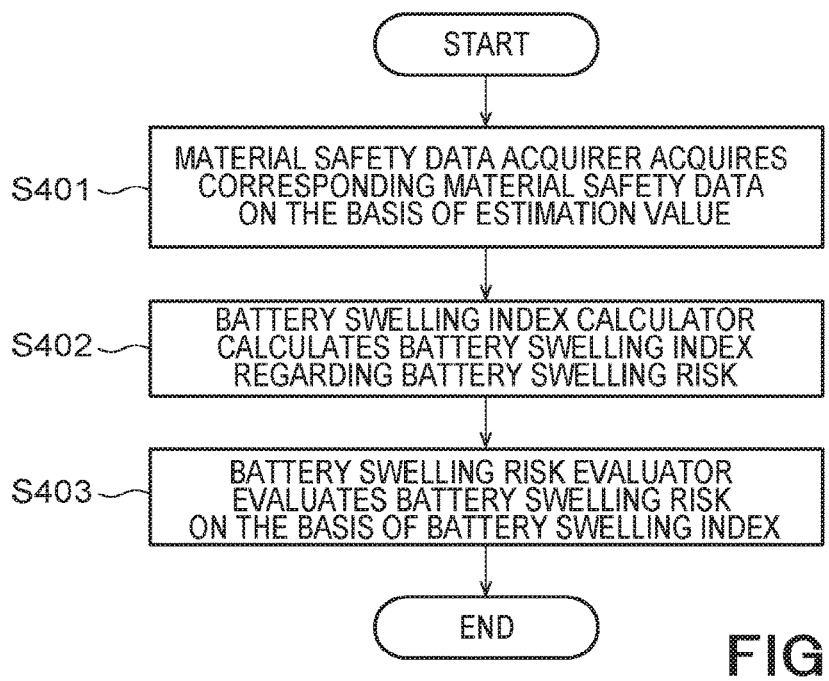
FIG. 12 is a diagram exemplarily illustrating a flowchart of a battery swelling risk evaluation process.

FIG. 12 is a diagram illustrating an example of a flowchart of the battery safety evaluation process. The battery safety evaluation process is performed after calculating the estimation value of the battery characteristic or the like of the storage battery 1 by the battery characteristic estimator 25 or the internal resistance corrector 26.

The material safety data acquirer 272 acquires the material safety data corresponding to the storage battery 1 from the material safety data storage 271 on the basis of the estimation value of the inner state parameter or the battery characteristic acquired from the battery characteristic estimator 25 or the internal resistance corrector 26 (S401).

Incidentally, in the case where the material safety data storage 271 is realized by a database or the like, the battery characteristic or the like may be recorded as an attribution in association with the material safety data. In such a case, by using a management function such as RDBMS, the material safety data can be extracted on the basis of the estimation value of the battery characteristic or the like. Incidentally, the material safety data may be extracted even when the estimation value is within a predetermined range for the value of the battery characteristic or the like corresponding to the material safety data, the estimation data not completely coinciding with the material safety data.

The battery swelling index calculator 273 calculates the safety index regarding the battery swelling risk (S402). The battery swelling risk determiner 274 determines the battery swelling risk evaluation on the basis of the battery swelling index (S403). The above is a flow of the battery safety evaluation process. Incidentally, it is supposed that the safety evaluation is sent to the output device 28, but it may be sent to another component, for example, the material safety data storage 271.

Incidentally, when it is determined that the state of the storage battery 1 is changed, the battery safety evaluator 27 may perform the battery safety evaluation process. The battery characteristic estimator 25 may determine that the state of the storage battery 1 is changed, or the battery safety evaluator 27 may determine that. Otherwise, the state of the storage battery 1, the material safety data corresponding to the relevant state, and the like being output through the output device 28, a user of the storage battery 1, an administrator of the battery safety evaluation apparatus 2, or the like who has seen the relevant output may give an instruction through a not-shown input device.

The output device 28 outputs the calculated battery swelling risk evaluation result and the like. For example, when it is determined that the battery swelling risk of the storage battery 1 is "danger", the output device 28 may accept the battery swelling index in the occasion when battery swelling of the storage battery 1 arises, in other words, a positive electrode capacity decrease rate in FIG. 11A from the battery swelling index calculator 273, and output it. An output method is not specially limited but it may give a file, a mail, an image, sound, light and the like. For example, the battery safety evaluation apparatus 2 being connected to a display, a speaker and the like through the output device 28, the results of the processes of the components may be output to another device. For example, when the battery swelling risk evaluation is "danger", an image or light warning a user may be displayed on the display in order to cause the user to recognize the danger, or warning sound may be output from the speaker. Incidentally, information output by the output device 28 is not specially limited. For example, information used for the battery swelling risk evaluation, such as the inner state parameter, the battery characteristic and the material safety data, may be output.

As described above, according to the first embodiment, the inner state parameters and the battery characteristics of the storage battery 1 are estimated on the basis of the voltage and the current of the storage battery 1. Then, the battery swelling index is calculated on the basis of the inner state parameters or the battery characteristics. Battery swelling risk evaluation based on the battery swelling index enables evaluation of present safety of the storage battery 1.

Moreover, since safety of the storage battery 1 can be evaluated on the basis of the voltage and the like, a function of directly measuring the inner state parameters is not needed, which can suppress costs for production of the safety evaluation apparatus.

Second Embodiment

The battery safety evaluation apparatus 2 of a second embodiment not only outputs the determined battery swelling risk evaluation to an external apparatus or the like, but also changes control regarding charge/discharge of the storage battery 1 in accordance with the determined battery swelling risk evaluation.

Figure 13:
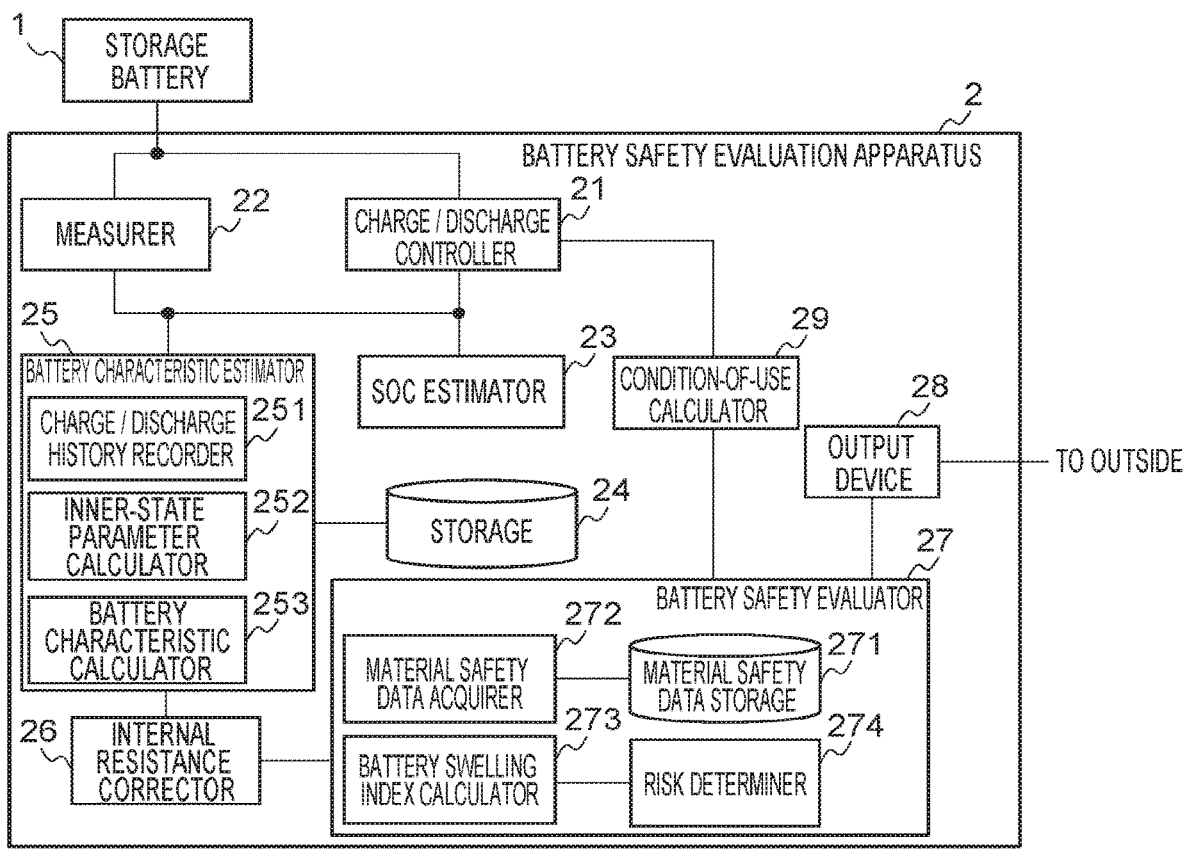
FIG. 13 is a block diagram exemplarily illustrating a schematic configuration of a power storage system according to a second embodiment.

FIG. 13 is a block diagram illustrating an example of a schematic configuration of a power storage system according to the second embodiment. The second embodiment is different from the first embodiment in that the battery safety evaluation apparatus 2 further includes a condition-of-use calculator. Description of the same matters as those of the first embodiment is omitted.

It is supposed that the charge/discharge controller 21 controls charge/discharge not only for evaluating safety of the storage battery 1 but also for using the storage battery 1. Moreover, charge/discharge controller 21 changes control of charge/discharge in accordance with the battery swelling risk evaluation made by the battery safety evaluator 27. For example, in the case of the battery swelling risk evaluation that use is to be stopped, the charge/discharge controller 21 controls charge/discharge to be stopped. In the case of the battery swelling risk evaluation that use may be continued, the charge/discharge controller 21 performs charge/discharge. In this stage, the charge/discharge is performed so as to satisfy a condition of use calculated by the condition-of-use calculator.

In the case of the battery swelling risk evaluation that use may be continued but should be limited, the condition-of-use calculator calculates (updates) the condition of use. For example, it is considered that in the case where a condition of use in the present state is continued when the battery swelling risk evaluation is the aforementioned "attention", the battery swelling risk evaluation soon becomes the afore- mentioned "danger". Therefore, when the battery swelling risk evaluation is "attention", the condition of use is changed.

Figure 14:
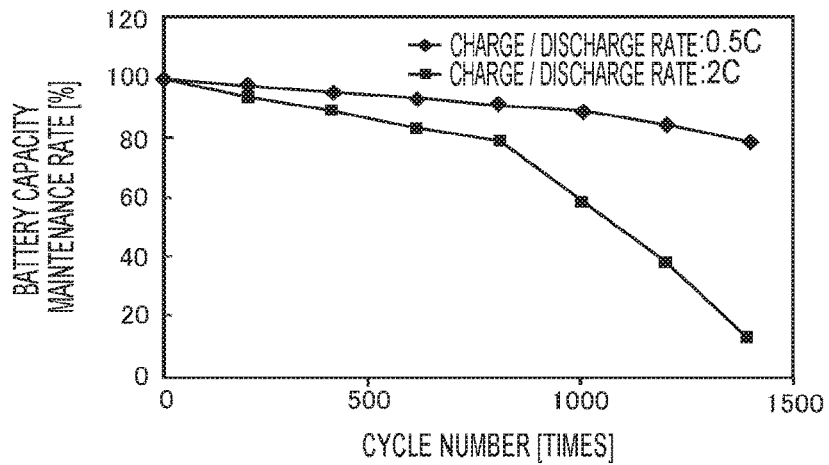
FIG. 14 is a diagram exemplarily illustrating a difference in positive electrode capacity maintenance rate due to a difference in used current value.

The conditions of use beforehand associated with the types of the battery swelling risk evaluation, the condition-of-use calculator may select the condition of use in accordance with the type of the battery swelling risk evaluation. Otherwise, the upper limit of the current value range usable for the storage battery 1 may be lowered. In general, as illustrated in FIG. 14, the larger the current is, the faster the deterioration progress of the battery is. Hence, the upper limit is minimized down to a value at which the deterioration progress of the battery is moderate. By minimizing a used current value, decrease of the positive electrode capacity maintenance rate becomes moderate, which enables continuous use in a region of "attention".

Incidentally, in the case where the condition of use is not needed to be updated, for example, in the case of only two types of use to be continued and use to be stopped, the condition-of-use calculator may be absent. Meanwhile, the charge/discharge controller 21 is not needed to perform charge/discharge on the basis of the condition of use created by the condition-of-use calculator. For example, the output device 28 outputting the created condition of use to an external apparatus, the external apparatus may charge/discharge the storage battery so as to satisfy the condition of use.

Figure 15:
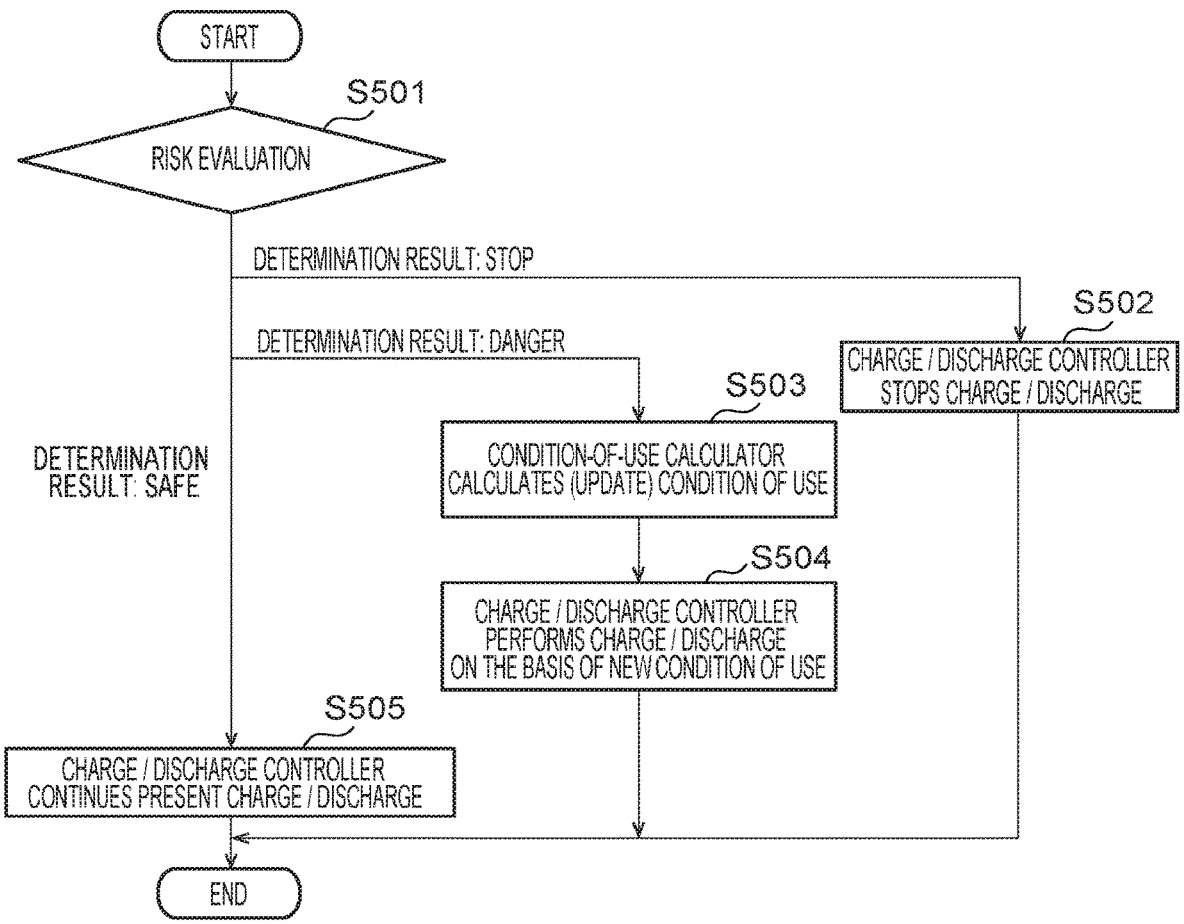
FIG. 15 is a diagram exemplarily illustrating a flowchart for a schematic process of a battery safety evaluation apparatus according to the second embodiment.

FIG. 15 is a diagram illustrating an example of a flowchart of schematic processes with the battery safety evaluation apparatus 2 of the second embodiment. FIG. 15 illustrates processes in and after S105 of the flowchart of the schematic processes illustrated in FIG. 2. The processes before and in S105 are the same, and hence, skipped in the figure. Incidentally, independently to the process of S105, this flow may be performed.

When the risk evaluation is "stop" ("STOP" in S501), the charge/discharge controller 21 stops charge/discharge (S502). When the risk evaluation is "danger" ("DANGER" in S501), the condition-of-use calculator 29 calculates a new condition of use (S503). Then, the charge/discharge controller 21 performs charge/discharge on the basis of the new condition of use (S504). When the risk evaluation is "safe" ("SAFE" in S501), the charge/discharge controller 21 continues charge/discharge that has been performed (S505). The above is a flow of schematic processing with the battery safety evaluation apparatus 2 of the second embodiment.

As described above, according to the second embodiment, charge/discharge of the storage battery 1 is controlled on the basis of the determined battery swelling risk evaluation. By the change to charge/discharge matching the present state of the storage battery 1, the life of the storage battery 1 can be elongated while securing safety thereof.

Third Embodiment

In the aforementioned embodiments, the material safety data acquirer 272 acquires the material safety data corresponding to the storage battery 1 from the material safety data stored in the material safety data storage 271. However, the states of the storage battery 1 are various, to store all the material safety data in the material safety data storage 271 needs the capacity of the material safety data storage 271 to be enlarged. Moreover, the material safety data storage 271 possibly does not have relevant material safety data corresponding to the storage battery 1. Therefore, in the third embodiment, the material safety data is externally acquired and updated. Thereby, the amount of the material safety data stored in the material safety data storage 271 can be reduced, and downsizing of the battery safety evaluator 27 and reduction of costs in production of the battery safety evaluator 27 can be realized. Moreover, types of corresponding storage batteries 1 can be increased.

Figure 16:
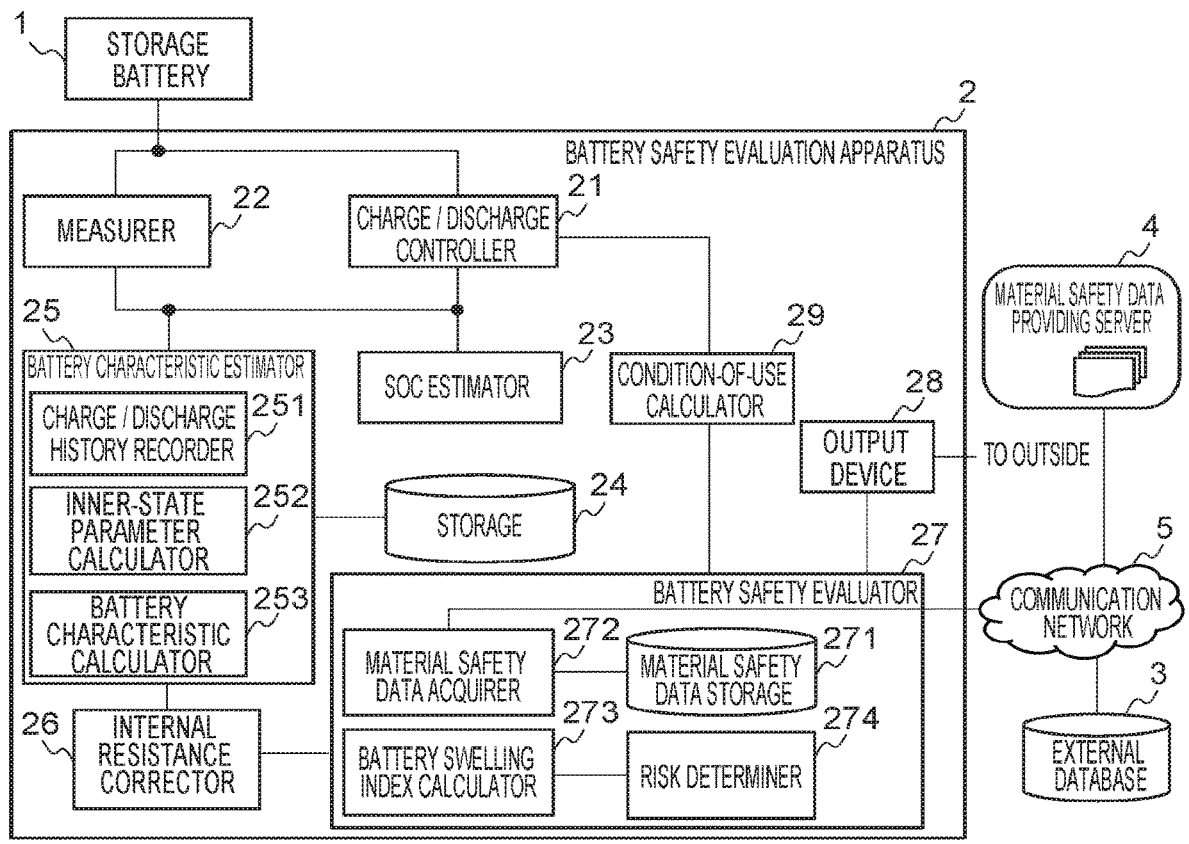
FIG. 16 is a block diagram exemplarily illustrating a schematic configuration of a power storage system according to a third embodiment.

FIG. 16 is a block diagram exemplarily illustrating a schematic configuration of a power storage system according to the third embodiment. The third embodiment is different from the aforementioned embodiments in that the material safety data acquirer 272 is connected to the outside. Description of the same matters as those of the aforementioned embodiments is omitted.

The material safety data acquirer 272 is connected to an apparatus or the like that provides material safety data via wired or wireless communication, or via an electric signal so as to transmit and receive data. The apparatus or the like that provides material safety data is not specially limited but may be an external database 3 storing material safety data or may be a material safety data providing server 4 that generates and provides material safety data. Hereinafter, the apparatus or the like that provides material safety data is referred to as "material safety data providing apparatus". The material safety data acquirer 272 may be connected to the material safety data providing apparatus via a communication network 5. Alternatively, it may be connected directly or indirectly to the external database 3 via a device interface.

Acquisition of material safety data by the material safety data acquirer 272 is assumed to be performed when material safety data corresponding to the storage battery 1 is lacked. However, such a timing is not limited to a particular timing. For example, acquisition may be performed when the material safety data providing apparatus generates new material safety data, or may be performed regularly. When necessary material safety data is not found in the material safety data storage 271, material safety data corresponding to the standard, battery characteristic, inner state parameter, or the like of the storage battery 1 is acquired on the basis thereof. Incidentally, material safety data may be acquired from the material safety data providing apparatus without specifying a condition and the like. Moreover, material safety data which has been acquired but is considered not to be necessary may not be stored in the material safety data storage 271.

Incidentally, the material safety data storage 271 may delete material safety data stored therein. For example, for capacity saving, it is not necessary for the material safety data storage 271 to store therein material safety data satisfying a predetermined deletion condition, such as expired material safety data and material safety data which is seldom used.

Figure 17:
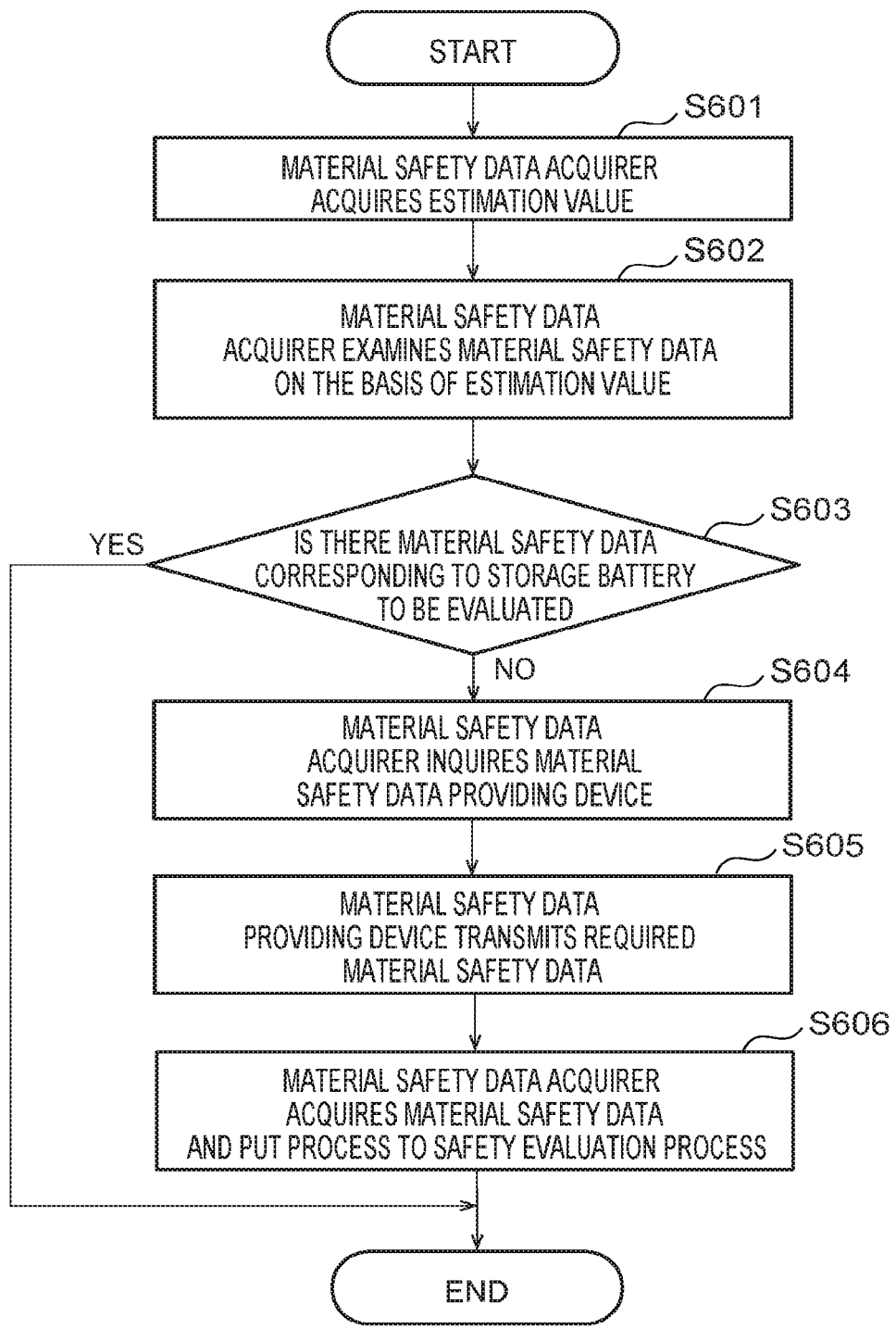
FIG. 17 is a diagram exemplarily illustrating a flowchart of a material safety data acquisition process.

FIG. 17 is a diagram exemplarily illustrating a flowchart of a material safety data acquisition process. This flowchart illustrates a flow in the case where the material safety data is acquired before the battery safety evaluation process.

The material safety data acquirer 272 acquires the estimation value of the battery characteristic or the like of the storage battery 1 from the battery characteristic estimator 25 or the internal resistance corrector 26 (S601). The material safety data acquirer 272 determines whether the material safety data storage 271 stores therein material safety data corresponding to the storage battery 1, on the basis of the acquired estimation value (S602).

When the material safety data storage 271 stores material safety data corresponding to the storage battery 1 (YES in S603), the flow is ended. When the material safety data storage 271 does not store material safety data corresponding to the storage battery 1 (NO in S603), the material safety data acquirer 272 sends an inquiry to the material safety data providing apparatus (S604). The inquiry is assumed to include the acquired estimation value.

The material safety data providing apparatus transmits material safety data which is set to correspond to the storage battery 1 on the basis of the received estimation value of the battery characteristic or the like (S605). Then, the material safety data acquirer 272 acquires the transmitted material safety data, and proceeds to the battery safety evaluation process (S606). The battery safety evaluation process is As described above. The flow of the material safety data acquisition process has been described.

As described above, according to the third embodiment, even if material safety data required for the battery safety evaluation process is not stored in the material safety data storage 271, required material safety data can be acquired on the basis of the battery characteristic or the like of the storage battery 1. Thereby, an amount of material safety data stored in the material safety data storage 271 can be reduced, and thereby, downsizing of the battery safety evaluator 27 or reduction in cost for manufacturing the battery safety evaluator 27 can be achieved. Moreover, the number of types of the supported storage battery 1 can be increased.

Each process in the embodiments described above can be implemented by software (program). Thus, the embodiments described above can be implemented using, for example, a general-purpose computer apparatus as basic hardware and causing a processor mounted in the computer apparatus to execute the program.

Figure 18:
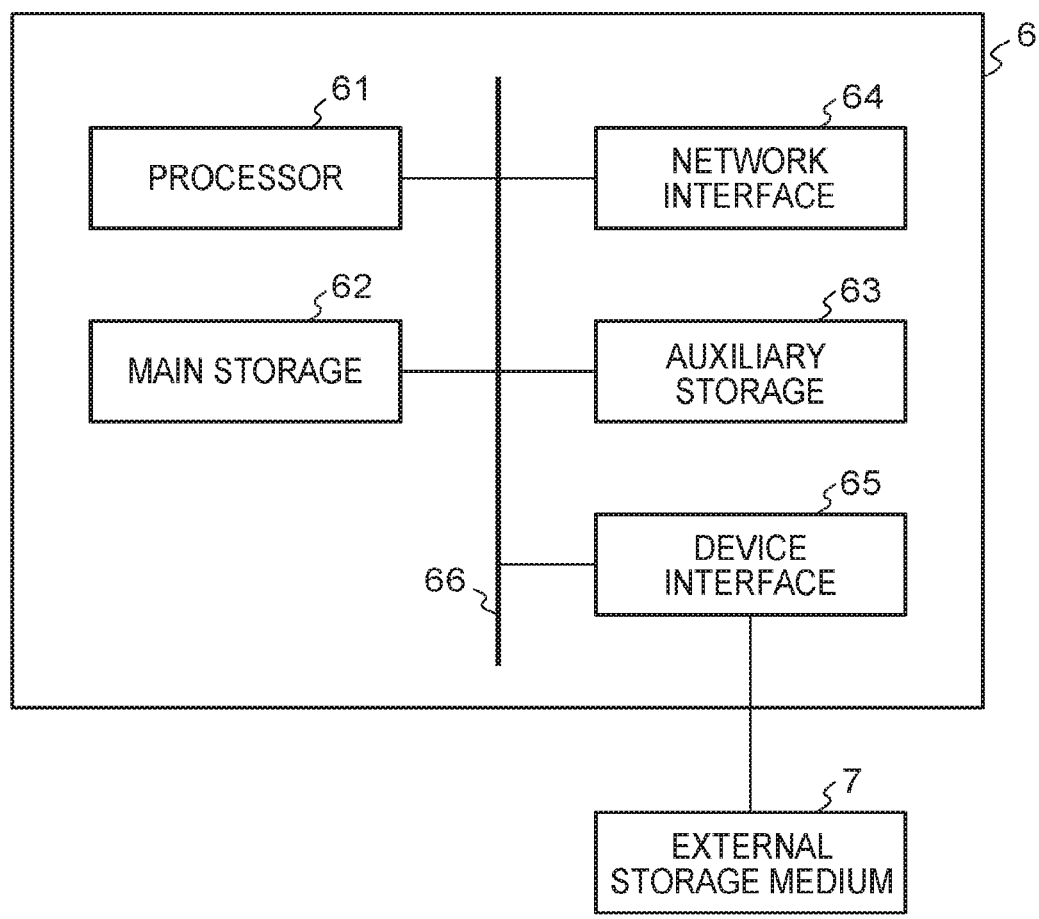
FIG. 18 is a block diagram illustrating an example of a hardware configuration in an embodiment of the present invention.

FIG. 18 is a block diagram illustrating an example of a hardware configuration according to an embodiment of the present invention. The battery safety evaluation apparatus 2 can be realized by a computer device 6 including a processor 61, a main storage 62, an auxiliary storage 63, a network interface 64, and a device interface 65, which are connected to one another via a bus 66.

The processor 61 reads out a program from the auxiliary storage 63, develops the program onto the main storage 62, and executes the program. As a result of this, functions of the charge/discharge controller 21, the measurer 22, the SOC estimator 23, the battery characteristic estimator 25, the internal-resistance corrector 26, and the battery safety evaluator 27 can be achieved.

The processor 61 is an electronic circuit including a controller and a calculator of a computer. As the processor 61, a general-purpose processor, a central processor (CPU), a microprocessor, a digital signal processor (DSP), a controller, a microcontroller, a state machine, an application specific integrated circuit, a field programmable gate array (FPGA), a programmable logic circuit (PLD), or the combination thereof can be used, for example.

The battery safety evaluation apparatus 2 of the present embodiment may be realized by installing a program to be executed by the components into the computer device 6 in advance, or installing the program, which is stored in a storage medium such as a CD-ROM or distributed via a network, into the computer device 6 as proper timing.

The main storage 62 is a memory that temporarily stores an instruction to be executed by the processor 61, various types of data, and the like, and may be a volatile memory such as a DRAM, or may be a non-volatile memory such as an MRAM. The auxiliary storage 63 is a storage that permanently stores a program, data, and the like. For example, the auxiliary storage 63 is a flash memory, for example.

The network interface 64 is an interface for wired or wireless connection to a communication network. In the case where the material safety data acquirer 272 communicates with the material safety data providing apparatus, the communication processing function of the material safety data acquirer 272 can be realized by the network interface 64. In the drawing, only one network interface 64 is illustrated, but a plurality of network interfaces 64 may be mounted.

The device interface 65 is an interface such as a USB for connection to an external storage medium 7 that stores therein an output result and the like. In the case where the material safety data providing apparatus is the external storage medium 7, a function for data exchange between the material safety data acquirer 272 and the external storage medium 7 can be realized by the device interface 65. The external storage medium 7 may be an arbitrary storage medium such as an HDD, a CD-R, a CD-RW, a DVD-RAM, a DVD-R, a SAN (storage area network), or the like. The external storage medium 7 may be connected to the storage battery 1 via the device interface 65.

The computer device 6 may be configured by dedicated hardware such as a semiconductor integrated circuit having the processor 61 mounted thereon. The dedicated hardware may be configured by combination with a storage such as an RAM or an ROM. The computer device 6 may be incorporated inside the storage battery 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A battery safety evaluation apparatus comprising:
   a battery characteristic estimator configured to estimate an estimation value of an inner state parameter of a first battery which is a secondary battery to be evaluated on the basis of data of voltage and current of the first battery measured in charging or discharging the first battery;
   a battery swelling index calculator configured to (i) derive a positive electrode capacity maintenance rate and a negative electrode capacity maintenance rate of the first battery on the basis of first reference data, the first reference data being reference data considered to correspond to the first battery on the basis of the estimation value, the reference data at least indicating relationship between a positive electrode capacity and a negative electrode capacity of a secondary battery, and (ii) calculate a ratio of the positive electrode capacity maintenance rate to the negative electrode capacity maintenance rate or a ratio of the negative electrode capacity maintenance rate to the positive electrode capacity maintenance rate as a battery swelling index regarding battery swelling of the first battery; and
   a battery safety valuator configured to evaluate, on the basis of the battery swelling index of the first battery, a battery swelling risk of the first battery to evaluate safety of the first battery or an assembled battery including the first battery.

2. The battery safety evaluation apparatus according to claim 1, wherein
   the battery swelling is caused by deformation of an electrode and an electrode group due to gas generation or a deterioration product.

3. The battery safety evaluation apparatus according to claim 1, wherein
   the battery safety evaluator evaluates that the first battery is safe when the battery swelling index exceeds a threshold; and
   the threshold is set greater when the battery swelling index is the ratio of the positive electrode capacity maintenance rate to the negative electrode capacity maintenance rate than when the battery swelling index is the ratio of the negative electrode capacity maintenance rate to the positive electrode capacity maintenance rate.

4. The battery safety evaluation apparatus according to claim further comprising
   an output device configured to output the battery swelling index or evaluation based on the battery swelling index.

5. The battery safety evaluation apparatus according to claim 4, wherein
   the output device outputs a value of the battery swelling index.

6. The battery safety evaluation apparatus according to claim 4, wherein
   the output device displays content of output as an image.

7. The battery safety evaluation apparatus according to claim 4, wherein
   the output device outputs content of output as a file.

8. The battery safety evaluation apparatus according to claim 4, wherein
   the output device outputs an image, light or sound indicating warning on the basis of the battery swelling index.

9. The battery safety evaluation apparatus according to claim 1, wherein
   the battery characteristic estimator estimates an estimation value of a battery characteristic on the basis of the inner state parameter, and
   the first reference data is determined to correspond to the first battery on the basis of the estimation value of the battery characteristic.

10. The battery safety evaluation apparatus according to claim 1, further comprising
    a reference data acquirer configured to acquire the first reference data on the basis of the estimation value.

11. A battery control apparatus comprising:
    the battery safety evaluation apparatus according to claim 1; and
    a charge/discharge controller configured to perform control so as to stop charge or discharge of the first battery on the basis of the battery swelling index.

12. The battery control apparatus according to claim 11, further comprising
    a condition-of-use calculator configured to update a condition of use to be used in charging or discharging the first battery so that the deterioration progress of the first battery is moderate when the battery swelling index exceeds a threshold.

13. A battery safety evaluation method comprising:
    estimating an estimation value of an inner state parameter of a first battery which is a secondary battery to be evaluated on the basis of data of voltage and current of the first battery measured in charging or discharging the first battery;
    deriving a positive electrode capacity maintenance rate and a negative electrode capacity maintenance rate of the first battery on the basis of first reference data, the first reference data being reference data considered to correspond to the first battery on the basis of the estimation the reference data at least indicating, relationship between a positive electrode capacity and a negative electrode capacity of a secondary battery;

calculating a ratio of the positive electrode capacity maintenance rate to the negative electrode capacity maintenance rate or a ratio of the negative electrode capacity maintenance rate to the positive electrode capacity maintenance rate as a battery swelling index regarding battery swelling of the first battery; and evaluating, on the basis of the battery swelling index of the first battery, a battery swelling risk of the first battery to evaluate safety of the first battery or an assembled battery including the first battery.

14. A non-transitory computer readable medium having a program comprising:

estimating an estimation value of an inner state parameter of a first battery which is a secondary battery to be evaluated on the basis of data of voltage and current of the first battery measured in charging or discharging the first battery; and deriving a positive electrode capacity maintenance rate and a negative electrode capacity maintenance rate of the first battery on the basis of first reference data, the first reference data being reference data considered to correspond to the first battery on the basis of the estimation value, the reference data at least indicating, relationship between a positive electrode capacity and a negative electrode capacity of a secondary batter;

calculating a ratio of the positive electrode capacity maintenance rate to the negative electrode capacity maintenance rate or a ratio of the negative electrode capacity maintenance rate to the positive electrode capacity maintenance rate as a battery swelling index regarding battery swelling of the first battery; and evaluating, on the basis of the battery swelling index of the first battery, a battery swelling risk of the first battery to evaluate safety of the first battery or an assembled battery including the first battery.

15. A control circuit comprising:

a battery characteristic estimator configured to estimate an estimation value of an inner state parameter of a first battery which is a secondary battery to be evaluated on the basis of data of voltage and current of the first battery measured in charging or discharging the first battery;

a battery swelling index calculator configured to (i) derive a positive electrode capacity maintenance rate and a negative electrode capacity maintenance rate of the first battery on the basis of first reference data, the first reference data being reference data considered to correspond to the first battery on the basis of the estimation value, the reference data at least indicating relationship between a positive electrode capacity and a negative electrode capacity of a secondary battery, and (ii) calculate a ratio of the positive electrode capacity maintenance rate to the negative electrode capacity maintenance rate or a ratio of the negative electrode capacity maintenance rate to the positive electrode capacity maintenance rate as a batter swelling index regarding battery swelling, of the first battery; and a battery safety evaluator configured to evaluate, on the basis of the battery swelling index of the first battery, a battery swelling risk of the first battery to evaluate safety of the first battery or an assembled battery including the first battery.

16. A power storage system comprising:

a first battery which is a secondary battery to be evaluated; and a battery safety evaluation apparatus, wherein the battery safety evaluation apparatus comprising:

a battery characteristic estimator configured to estimate an estimation value of an inner state parameter of a first battery which is a secondary battery to be evaluated on the basis of data of voltage and current of the first battery measured in charging or discharging the first battery;

a battery swelling index calculator configured to (i) derive a positive electrode capacity maintenance rate and a negative electrode capacity maintenance rate of the first battery on the basis of first reference data, the first reference data being reference data considered to correspond to the first battery on the basis of the estimation value, the reference data at least indicating relationship between a positive electrode capacity and a negative electrode capacity of a secondary battery, and (ii) calculate a ratio of the positive electrode capacity maintenance rate to the negative electrode capacity maintenance rate or a ratio of the negative electrode capacity maintenance rate to the positive electrode capacity maintenance rate as a battery swelling index regarding battery swelling of the first battery;

a battery safety evaluator configured to evaluate, on the basis of the batter swelling index of the first battery, a battery swelling risk of the first battery to evaluate safety of the first battery or an assembled battery including the first battery; and an output device configured to outputs a value of the battery swelling index.

* * * * *